US012727350B2

(12) United States Patent
Liu et al.

(10) Patent No.: US 12,727,350 B2
(45) Date of Patent: Sep. 1, 2026

(54) DISPLAY PANEL AND DISPLAY DEVICE

(71) Applicant: BOE TECHNOLOGY GROUP CO., LTD., Beijing (CN)

(72) Inventors: Libin Liu, Beijing (CN); Yu Feng, Beijing (CN); Li Wang, Beijing (CN); Baoyun Wu, Beijing (CN); Shiming Shi, Beijing (CN); Dawei Wang, Beijing (CN); Haijun Qiu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/996,104

(22) PCT Filed: Aug. 31, 2022

(86) PCT No.: PCT/CN2022/116253
§ 371 (c)(1),
(2) Date: Jan. 17, 2025

(87) PCT Pub. No.: WO2024/045059
PCT Pub. Date: Mar. 7, 2024

(65) Prior Publication Data

US 2026/0052857 A1 Feb. 19, 2026

(51) Int. Cl.
*H10K 59/131* (2023.01)
*G09G 3/3258* (2016.01)
(Continued)

(52) U.S. Cl.
CPC ......... *H10K 59/131* (2023.02); *G09G 3/3258* (2013.01); *H10D 86/421* (2025.01);
(Continued)

(58) Field of Classification Search
CPC ............. H10K 59/131; H10K 59/1213; H10K 59/123; H10K 59/126; H10D 86/421;
(Continued)

(56) References Cited

U.S. PATENT DOCUMENTS

2022/0223112 A1* 7/2022 Kim .................... G09G 3/3283

FOREIGN PATENT DOCUMENTS

CN 112885884 A 6/2021
CN 113838424 A 12/2021
(Continued)

OTHER PUBLICATIONS

The extended European search report of EP Application No. 22956888.6 dated Oct. 7, 2025, (13p).
(Continued)

*Primary Examiner* — Deeprose Subedi
(74) *Attorney, Agent, or Firm* — Arch & Lake LLP

(57) ABSTRACT

A display panel and a display device are provided. The display panel includes a pixel driving circuit on a side of a substrate. The pixel driving circuit includes a drivier transistor; a ninth transistor with a first electrode being connected to a third initial signal line, and a second electrode being connected to a first electrode of the driver transistor; an eighth transistor with a first electrode being connected to a gate of the driver transistor; a first transistor with a first electrode being connected to a first initial signal line, and a second electrode being connected to a second electrode of the eighth transistor; and a second transistor with a first electrode being connected to the second electrode of the eighth transistor, and a second electrode being connected to a second electrode of the driver transistor.

19 Claims, 22 Drawing Sheets

(51) Int. Cl.

| | |
|---|---|
| ***H10D 86/40*** | (2025.01) |
| ***H10D 86/60*** | (2025.01) |
| ***H10K 59/121*** | (2023.01) |
| ***H10K 59/123*** | (2023.01) |
| ***H10K 59/126*** | (2023.01) |

(52) U.S. Cl.

CPC ........... *H10D 86/441* (2025.01); *H10D 86/60* (2025.01); *H10K 59/1213* (2023.02); *H10K 59/123* (2023.02); *G09G 2300/0408* (2013.01); *G09G 2300/0426* (2013.01); *G09G 2300/0465* (2013.01); *G09G 2300/0819* (2013.01); *G09G 2300/0842* (2013.01); *G09G 2300/0861* (2013.01); *G09G 2310/08* (2013.01); *G09G 2320/0233* (2013.01); *G09G 2320/0257* (2013.01); *G09G 2320/045* (2013.01); *H10K 59/126* (2023.02)

(58) Field of Classification Search

CPC .... H10D 86/441; H10D 86/60; G09G 3/3258; G09G 2300/0408; G09G 2300/0426; G09G 2300/0465; G09G 2300/0819; G09G 2300/0842; G09G 2300/0861; G09G 2310/08; G09G 2320/0233; G09G 2320/0257; G09G 2320/045

See application file for complete search history.

(56) References Cited

FOREIGN PATENT DOCUMENTS

| | | | |
|---|---|---|---|
| CN | 114122101 | A | 3/2022 |
| CN | 114175257 | A | 3/2022 |
| CN | 114207703 | | 3/2022 |
| CN | 114222615 | A | 3/2022 |
| CN | 114550653 | A | 5/2022 |
| CN | 114695491 | A | 7/2022 |
| CN | 217134377 | U | 8/2022 |
| CN | 117642801 | A | 3/2024 |
| EP | 4517729 | A1 | 3/2025 |

OTHER PUBLICATIONS

CNOA issued in Application No. 202280002939.4 dated Nov. 28, 2025 with English translation, (24p).

International Search Report of PCT Application No. PCT/CN2022/116253 dated May 9, 2023 with English translation, (6p).

Written Opinion of the International Search Authority issued in PCT Application No. PCT/CN2022/116253 dated May 9, 2023, (8p).

* cited by examiner

DISPLAY PANEL AND DISPLAY DEVICE

CROSS-REFERENCE TO RELATED APPLICATIONS

The present disclosure is the U.S. National phase application of International Application No. PCT/CN2022/116253, filed on Aug. 31, 2022, the entire contents of which are incorporated herein by reference in its entirety for all purposes.

TECHNICAL FIELD

The present disclosure relates to the field of display technology, and in particular to a display panel and a display device.

BACKGROUND

In related art, hysteresis in the driver transistors may cause residual images in the display panel.

It should be noted that the information disclosed above in the "BACKGROUND" section is intended only to enhance understanding of the background of the present disclosure, and thus may include information that does not constitute prior art known to those of ordinary skill in the art.

SUMMARY

According to an aspect of the present disclosure, a display panel is provided. The display panel includes a substrate and a pixel driving circuit. The pixel driving circuit is on a side of the substrate, and the pixel driving circuit includes a drivier transistor, a ninth transistor, an eighth transistor, a first transistor, and a second transistor. A first electrode of the ninth transistor is connected to a third initial signal line, and a second electrode of the ninth transistor is connected to a first electrode of the driver transistor. A first electrode of the eighth transistor is connected to a gate of the driver transistor. A first electrode of the first transistor is connected to a first initial signal line, and a second electrode of the first transistor is connected to a second electrode of the eighth transistor. A first electrode of the second transistor is connected to the second electrode of the eighth transistor, and a second electrode of the second transistor is connected to a second electrode of the driver transistor.

In an exemplary embodiment of the present disclosure, the display panel further includes a first active layer, a first conductive layer, a second active layer, and a third conductive layer. The first active layer is on a side of the substrate and the first active layer includes a second active portion and a third active portion. The second active portion is configured to form a channel region of the second transistor. The third active portion is configured to form a channel region of the driver transistor. The first conductive layer is on a side, away from the substrate, of the first active layer, and the first conductive layer includes a first gate line and a first conductive portion. An orthographic projection of the first gate line on the substrate extends in a first direction and covers an orthographic projection of the second active portion on the substrate, and a portion of a structure of the first gate line is configured to form a gate of the second transistor. An orthographic projection of the first conductive portion on the substrate covers an orthographic projection of the third active portion on the substrate, and the first conductive portion is configured to form the gate of the driver transistor. The second active layer is on a side, away from the substrate, of the first conductive layer, and the second active layer includes an eighth active portion configured to form a channel region of the eighth transistor. The third conductive layer is on a side, away from the substrate, of the second active layer, and the third conductive layer includes a second gate line, where an orthographic projection of the second gate line on the substrate extends in the first direction and covers an orthographic projection of the eighth active portion on the substrate, and a portion of a structure of the second gate line is configured to form a top gate of the eighth transistor. The orthographic projection of the first gate line on the substrate is between the orthographic projection of the second gate line on the substrate and the orthographic projection of the first conductive portion on the substrate.

In an exemplary embodiment of the present disclosure, the second active portion further includes a twentieth active portion connected to the eighth active portion, and the twentieth active portion is connected to the first conductive portion. An orthographic projection of the twentieth active portion on the substrate is at least partially overlapped with the orthographic projection of the first gate line on the substrate.

In an exemplary embodiment of the present disclosure, a size, in the first direction, of the orthographic projection of the twentieth active portion on the substrate is greater than a size, in a second direction, of the orthographic projection of the twentieth active portion on the substrate. The first direction intersects the second direction.

In an exemplary embodiment of the present disclosure, a size, in the first direction, of the orthographic projection of the eighth active portion on the substrate is L1, and a size, in the first direction, of the orthographic projection of the twentieth active portion on the substrate is L2. L2/L1 is greater than or equal to 2 and less than or equal to 7.

In an exemplary embodiment of the present disclosure, the pixel driving circuit further includes a fourth transistor, a first electrode of the fourth transistor being connected to a data line, and a second electrode of the fourth transistor being connected to the first electrode of the driver transistor. The display panel further includes a first active layer and a second active layer. The first active layer includes a second active portion and a fourth active portion, where the second active portion is configured to form a channel region of the second transistor, and the fourth active portion is configured to form a channel region of the fourth transistor. The second active layer is on a side, away from the substrate, of the first active layer, and the second active layer includes an eighth active portion configured to form a channel region of the eighth transistor. In the first direction, an orthographic projection of the eighth active portion on the substrate is between an orthographic projection of the second active portion on the substrate and an orthographic projection of the fourth active portion on the substrate.

In an exemplary embodiment of the present disclosure, the display panel further includes a light-emitting unit, where the pixel driving circuit is connected to a first electrode of the light-emitting unit, and the pixel driving circuit further includes a seventh transistor, a first electrode of the seventh transistor being connected to a second initial signal line, and a second electrode of the seventh transistor being connected to the first electrode of the light-emitting unit. The display panel further includes a first active layer and a first conductive layer. The first active layer is on a side of the substrate, and the first active layer includes a seventh active portion and a ninth active portion, where the seventh active portion is configured to form a channel region of the seventh transistor, and the ninth active portion is configured to form a channel region of the ninth transistor. The first conductive layer is on a side, away from the substrate, of the first active layer, and the first conductive layer includes a second reset signal line, where an orthographic projection of the second reset signal line on the substrate extends in a first direction and covers an orthographic projection of the seventh active portion on the substrate and an orthographic projection of the ninth active portion on the substrate, and a portion of a structure of the second reset signal line is configured to form a gate of the seventh transistor, and another portion of the structure of the second reset signal line is configured to form a gate of the ninth transistor.

In an exemplary embodiment of the present disclosure, the first active layer further includes a first active portion configured to form a channel region of the first transistor. The first conductive layer further includes a first reset signal line and a first conductive portion. An orthographic projection of the first reset signal line on the substrate covers an orthographic projection of the first active portion on the substrate, and a portion of a structure of the first reset signal line is configured to form a gate of the first transistor. The first conductive portion is configured to form the gate of the driver transistor. In a same pixel driving circuit, an orthographic projection of the first conductive portion on the substrate is between the orthographic projection of the first reset signal line on the substrate and the orthographic projection of the second reset signal line on the substrate; and the second reset signal line in the pixel driving circuit of a current row is shared as the first reset signal line in the pixel driving circuit of an adjacent next row.

In an exemplary embodiment of the present disclosure, the display panel further includes a first conductive layer, a second conductive layer, and a third conductive layer. The first conductive layer is on a side of the substrate, and the first conductive layer includes a first reset signal line and a first conductive portion, where a portion of a structure of the first reset signal line is configured to form a gate of the first transistor, and the first conductive portion is configured to form the gate of the driver transistor. The second conductive layer is on a side, away from the substrate, of the first conductive layer, and the second conductive layer includes the third initial signal line. The third conductive layer is on a side, away from the substrate, of the second conductive layer, and the third conductive layer includes a second gate line, where a portion of a structure of the second gate line is configured to form a top gate of the eighth transistor. In a same said pixel driving circuit, an orthographic projection of the first reset signal line on the substrate is on a side, away from an orthographic projection of the first conductive portion on the substrate, of an orthographic projection of the second gate line on the substrate; and an orthographic projection, on the substrate, of the third initial signal line in the pixel driving circuit of an adjacent previous row is between the orthographic projection, on the substrate, of the first reset signal line in the pixel driving circuit of a current row and the orthographic projection, on the substrate, of the second gate line in the pixel driving circuit of the current row.

In an exemplary embodiment of the present disclosure, the display panel further includes a light-emitting unit. The pixel driving circuit is connected to a first electrode of the light-emitting unit, and the pixel driving circuit further includes a seventh transistor, a first electrode of the seventh transistor being connected to a second initial signal line, and a second electrode of the seventh transistor being connected to the first electrode of the light-emitting unit. The display panel further includes a first conductive layer and a third conductive layer. The first conductive layer is on a side of the substrate, and the first conductive layer includes a first conductive portion, a second reset signal line, and a first gate line, where the first conductive portion is configured to form the gate of the driver transistor, a portion of a structure of the second reset signal line is configured to form a gate of the seventh transistor, and a portion of a structure of the first gate line is configured to form a gate of the second transistor. The third conductive layer is on a side, away from the substrate, of the first conductive layer, and the third conductive layer includes the first initial signal line. In a same pixel driving circuit, an orthographic projection of the second reset signal line on the substrate is on a side, away from an orthographic projection of the first gate line on the substrate, of an orthographic projection of the first conductive portion on the substrate; and an orthographic projection, on the substrate, of the first initial signal line in the pixel driving circuit of an adjacent next row is between the orthographic projection, on the substrate, of the second reset signal line in the pixel driving circuit of a current row and the orthographic projection, on the substrate, of the first conductive portion in the pixel driving circuit of the current row.

In an exemplary embodiment of the present disclosure, the pixel driving circuit further includes a fifth transistor, a first electrode of the fifth transistor being connected to a power line, and a second electrode of the fifth transistor being connected to the first electrode of the driver transistor. The display panel further includes a first active layer, a first conductive layer, and a third conductive layer. The first active layer is on a side of the substrate, and the first active layer includes a fifth active portion configured to form a channel region of the fifth transistor. The first conductive layer is on a side, away from the substrate, of the first active layer, and the first conductive layer includes an enable signal line, where an orthographic projection of the enable signal line on the substrate extends in a first direction and covers an orthographic projection of the fifth active portion on the substrate, and a portion of a structure of the enable signal line is configured to form a gate of the fifth transistor. The third conductive layer is on a side, away from the substrate, of the first conductive layer, and the third conductive layer includes the first initial signal line. An orthographic projection, on the substrate, of the first initial signal line in the pixel driving circuit of an adjacent next row is at least partially overlapped with the orthographic projection, on the substrate, of the enable signal line in the pixel driving circuit of a current row.

In an exemplary embodiment of the present disclosure, in a first unit pixel, an area of the orthographic projection, on the substrate, of the first initial signal line in the pixel driving circuit of the adjacent next row is S1. In the first unit pixel, an overlapping area, between the orthographic projection, on the substrate, of the first initial signal line in the pixel driving circuit of the adjacent next row and the orthographic projection, on the substrate, of the enable signal line in the pixel driving circuit of the current row, is S2. S2/S1 is greater than or equal to 60%.

In an exemplary embodiment of the present disclosure, the display panel further includes a light-emitting unit. The pixel driving circuit is connected to a first electrode of the light-emitting unit, and the pixel driving circuit further includes a seventh transistor, a first electrode of the seventh transistor being connected to a second initial signal line, and a second electrode of the seventh transistor being connected to the first electrode of the light-emitting unit. The display panel further includes a third conductive layer and a fourth conductive layer. The third conductive layer is on a side of the substrate. The fourth conductive layer is on a side, away from the substrate, of the third conductive layer, and the fourth conductive layer includes the second initial signal line, where the second initial signal line includes a first initial signal sub-line and/or a second initial signal sub-line. An orthographic projection of the first initial signal sub-line on the substrate extends in a first direction, and an orthographic projection of the second initial signal sub-line on the substrate extends in a second direction, the first direction and the second direction intersecting.

In an exemplary embodiment of the present disclosure, when the second initial signal line includes the first initial signal sub-line, an orthographic projection of the first initial signal sub-line on the substrate is at least partially overlapped with an orthographic projection of the third initial signal line on the substrate.

In an exemplary embodiment of the present disclosure, in a second unit pixel, an area of the orthographic projection of the first initial signal sub-line on the substrate is S3; an overlapping area, between the orthographic projection of the first initial signal sub-line on the substrate and the orthographic projection of the third initial signal line on the substrate, is S4; and S4/S3 is greater than or equal to 50%.

In an exemplary embodiment of the present disclosure, when the second initial signal line includes the first initial signal sub-line and the second initial signal sub-line, the second initial signal sub-line is connected to the first initial signal sub-line intersecting with the second initial signal sub-line.

In an exemplary embodiment of the present disclosure, the display panel includes a plurality of repeatable units distributed in an array along the first direction and the second direction, where the repeatable unit includes two pixel driving circuits distributed along the first direction, and the two pixel driving circuits in the same repeatable unit are disposed in mirror symmetry with respect to a mirror symmetry plane. More than one repeatable unit, among the repeatable units, distributed in the second direction form a repeatable unit column, where, when the second initial signal line includes the second initial signal sub-line, at least a portion of repeatable unit columns is provided in correspondence with one second initial signal sub-line, and an orthographic projection of the mirror symmetry plane on the substrate is located on the orthographic projection of the second initial signal sub-line on the substrate.

In an exemplary embodiment of the present disclosure, the display panel includes a plurality of repeatable units distributed in an array along a first direction and a second direction, where the repeatable unit includes two pixel driving circuits distributed along the first direction, and the two pixel driving circuits in the same repeatable unit are disposed in mirror symmetry with respect to a mirror symmetry plane, the first direction and the second direction intersecting. The pixel driving circuit further includes a fifth transistor, a first electrode of the fifth transistor being connected to a power line, and a second electrode of the fifth transistor being connected to the first electrode of the driver transistor. The display panel further includes a first active layer which includes a third active portion, a fifth active portion, and a thirteenth active portion, where the third active portion is configured to form a channel region of the driver transistor, the fifth active portion is configured to form a channel region of the fifth transistor, and the thirteenth active portion is connected to a side, away from the third active portion, of the fifth active portion. In repeatable units adjacent in the first direction, the fifth active portions in two adjacent pixel driving circuits are connected through the same thirteenth active portion, and the thirteenth active portion is connected to the power line.

In an exemplary embodiment of the present disclosure, the display panel includes a plurality of repeatable units distributed in an array along a first direction and a second direction, where the repeatable unit includes two pixel driving circuits distributed along the first direction, and the two pixel driving circuits in the same repeatable unit are disposed in mirror symmetry with respect to a mirror symmetry plane, the first direction and the second direction intersecting. The display panel further includes a light-emitting unit. The pixel driving circuit is connected to a first electrode of the light-emitting unit, and the pixel driving circuit further includes a sixth transistor and a seventh transistor. A first electrode of the sixth transistor is connected to the second electrode of the driver transistor, a second electrode of the sixth transistor is connected to the first electrode of the light-emitting unit, a first electrode of the seventh transistor is connected to a second initial signal line, and a second electrode of the seventh transistor is connected to the first electrode of the light-emitting unit. The display panel further includes a first active layer which includes a sixth active portion, a seventh active portion, and a seventeenth active portion, where the sixth active portion is configured to form a channel region of the sixth transistor, the seventh active portion is configured to form a channel region of the seventh transistor, and the seventeenth active portion is connected to a side, away from the sixth active portion, of the seventh active portion. In a same repeatable unit, the seventh active portions in two adjacent pixel driving circuits are connected through the same seventeenth active portion, and the seventeenth active portion is connected to the second initial signal line.

In an exemplary embodiment of the present disclosure, the display panel further includes a fourth conductive layer, a fifth conductive layer, an electrode layer, and a pixel definition layer. The fourth conductive layer is on a side of the substrate. The fifth conductive layer is on a side, away from the substrate, of the fourth conductive layer, where the fifth conductive layer includes a power line, an orthographic projection of the power line on the substrate extending in a second direction. The power line includes a first power line segment, a second power line segment, and a third power line segment, where the second power line segment is connected between the first power line segment and the third power line segment, two adjacent second power line segments are connected in a same repeatable unit, the connected second power line segments form a power supply portion, and a plurality of the power supply portions include a first power supply portion and a second power supply portion. The electrode layer is on a side, away from the substrate, of the fifth conductive layer, the electrode layer including a plurality of electrode portions, where the plurality of electrode portions include a first electrode portion and a second electrode portion, and an orthographic projection of the first electrode portion on the substrate is smaller than an orthographic projection of the second electrode portion on the substrate. The pixel definition layer is on a side, away from the substrate, of the electrode layer, and the pixel definition layer has a plurality of openings formed for forming light-emitting units, where the plurality of openings are provided in correspondence with the electrode portions, and an orthographic projection of the opening on the substrate coincides with an orthographic projection of the electrode portion provided in correspondence with the opening on the substrate. The first electrode portion is provided in correspondence with the first power supply portion, the second electrode portion is provided in correspondence with the second power supply portion, an orthographic projection of the first electrode portion on the substrate is at least partially overlapped with an orthographic projection of the first power supply portion provided in correspondence with the first electrode portion on the substrate, and an orthographic projection of the second electrode portion on the substrate is at least partially overlapped with an orthographic projection of the second power supply portion provided in correspondence with the second electrode portion on the substrate. An area of the orthographic projection of the second power supply portion on the substrate is greater than an area of the orthographic projection of the first power supply portion on the substrate, and an overlapping area, between the orthographic projection of the second power supply portion on the substrate and the orthographic projection of the second electrode portion corresponding to the second power supply portion on the substrate, is greater than an overlapping area, between the orthographic projection of the first power supply portion on the substrate and the orthographic projection of the first electrode portion corresponding to the first power supply portion on the substrate.

In an exemplary embodiment of the present disclosure, the display panel further includes a light-emitting unit. The pixel driving circuit further includes a fourth transistor, a fifth transistor, a sixth transistor, and a seventh transistor. A first electrode of the fourth transistor is connected to a data line, and a second electrode of the fourth transistor is connected to the first electrode of the driver transistor. A first electrode of the fifth transistor is connected to a power line, and a second electrode of the fifth transistor is connected to the first electrode of the driver transistor. A first electrode of the sixth transistor is connected to the second electrode of the driver transistor, and a second electrode of the sixth transistor is connected to a first electrode of the light-emitting unit. A first electrode of the seventh transistor is connected to a second initial signal line, and a second electrode of the seventh transistor is connected to the first electrode of the light-emitting unit. The first transistor, the second transistor, the driver transistor, the fourth transistor, the fifth transistor, the sixth transistor, the seventh transistor, and the ninth transistor are P-type transistors, and the eighth transistor is an N-type transistor.

According to an aspect of the present disclosure, a display device is provided. The display device includes the display panel as described above.

It should be understood that the above general description and the following detailed description are only exemplary and explanatory and cannot limit the present disclosure.

BRIEF DESCRIPTION OF THE DRAWINGS

The accompanying drawings herein are incorporated into and form a part of the specification, which illustrate embodiments consistent with the present disclosure, and are used in conjunction with the specification to explain the principles of the present disclosure. It is obvious that the accompanying drawings in the following description are only some of the embodiments of the present disclosure, and other drawings can be obtained from these drawings by those of ordinary skill in the art without creative labor.

DETAILED DESCRIPTION

Figure 1:
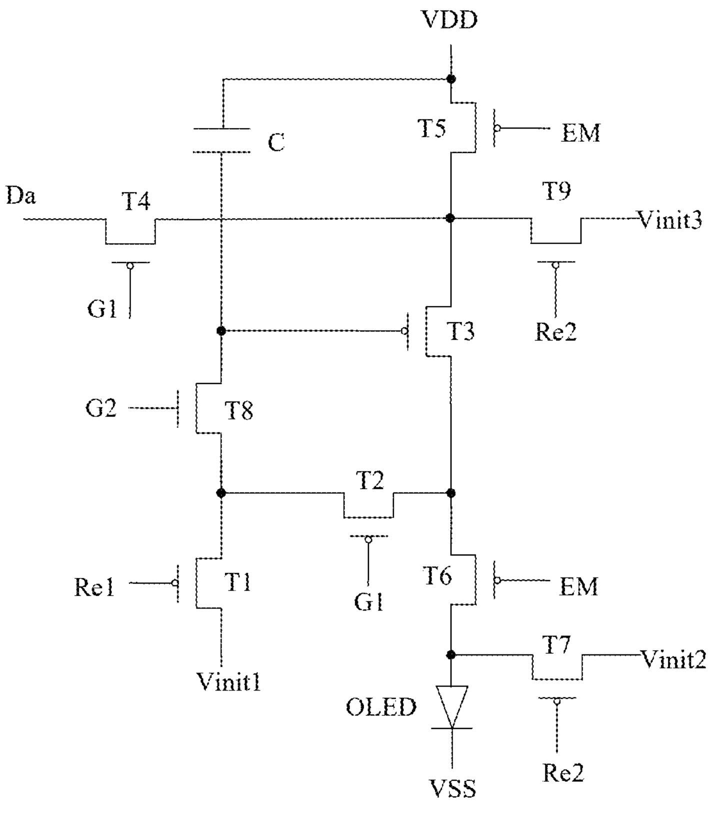
FIG. 1 is a schematic diagram of a circuit structure of a pixel driving circuit of a display panel according to an exemplary embodiment of the present disclosure.

Exemplary embodiments will now be described more fully with reference to the accompanying drawings. However, the exemplary embodiments can be implemented in a variety of forms and should not be construed as being limited to the examples set forth herein; rather, the provision of these embodiments allows for the present disclosure to be more comprehensive and complete and conveys the concept of the exemplary embodiments in a comprehensive manner to those skilled in the art. The same reference numerals in the drawings indicate the same or similar structures, and thus their detailed description will be omitted.

The terms "a," "an," and "this" are used to indicate the presence of one or more elements/components/etc. The terms "include" and "have" are used to indicate open-ended inclusion and mean that there may be additional elements/components/etc. in addition to those listed.

As shown in FIG. 1, it is a schematic diagram of a circuit structure of a pixel driving circuit of a display panel according to an exemplary embodiment of the present disclosure. The pixel driving circuit may include a first transistor T1, a second transistor T2, a driver transistor T3, a fourth transistor T4, a fifth transistor T5, a sixth transistor T6, a seventh transistor T7, an eighth transistor T8, a ninth transistor T9, and a capacitor C. A first electrode of the eighth transistor T8 is connected to a gate of the driver transistor T3, and a gate of the eighth transistor T8 is connected to a second gate driving signal terminal G2. A first electrode of the first transistor T1 is connected to a first initial signal terminal Vinit1, a second electrode of the first transistor T1 is connected to a second electrode of the eighth transistor T8, and a gate of the first transistor T1 is connected to a first reset signal terminal Re1. A first electrode of the second transistor T2 is connected to the second electrode of the eighth transistor T8, a second electrode of the second transistor T2 is connected to a second electrode of the driver transistor T3, and a gate of the second transistor T2 is connected to a first gate driving signal terminal G1. A first electrode of the fourth transistor T4 is connected to a data signal terminal Da, a second electrode of the fourth transistor T4 is connected to a first electrode of the driver transistor T3, and a gate of the fourth transistor T4 is connected to the first gate driving signal terminal G1. A first electrode of the fifth transistor T5 is connected to a first power supply terminal VDD, a second electrode of the fifth transistor T5 is connected to the first electrode of the driver transistor T3, and a gate of the fifth transistor T5 is connected to an enable signal terminal EM. A first electrode of the sixth transistor T6 is connected to the second electrode of the driver transistor T3, and a gate of the sixth transistor T6 is connected to the enable signal terminal EM. A first electrode of the seventh transistor T7 is connected to a second initial signal terminal Vinit2, a second electrode of the seventh transistor T7 is connected to the second electrode of the sixth transistor T6, and a gate of the seventh transistor T7 is connected to a second reset signal terminal Re2. A first electrode of the ninth transistor T9 is connected to a third initial signal terminal Vinit3, a second electrode of the ninth transistor T9 is connected to the first electrode of the driver transistor T3, and a gate of the ninth transistor T9 is connected to the second reset signal terminal Re2. A first electrode of the capacitor is connected to the gate of the driver transistor T3 and a second electrode of the capacitor is connected to the first power supply terminal VDD. The pixel driving circuit can be used to drive a light-emitting unit OLED to emit light. A first electrode of the light-emitting unit OLED is connected to the second electrode of the sixth transistor T6, and a second electrode of the light-emitting unit OLED is connected to a second power supply terminal VSS. The first transistor T1, the second transistor T2, the driver transistor T3, the fourth transistor T4, the fifth transistor T5, the sixth transistor T6, the seventh transistor T7, and the ninth transistor T9 may all be P-type transistors, and the eighth transistor T8 may be an N-type transistor.

Figure 2:
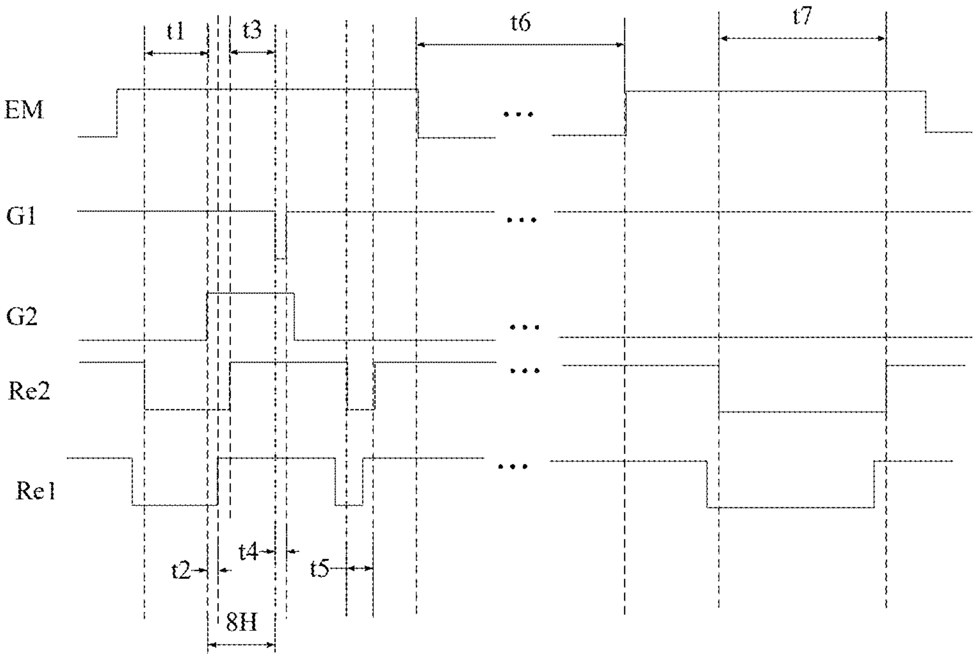
FIG. 2 is a timing diagram of signals on various nodes in the pixel driving circuit shown in FIG. 1.

As shown in FIG. 2, it is a timing diagram of signals on various nodes in the pixel driving circuit shown in FIG. 1. EM denotes a timing diagram of the signal on the enable signal terminal. G1 denotes a timing diagram of the signal on the first gate driving signal terminal. G2 denotes a timing diagram of the signal on the second gate driving signal terminal. Re1 denotes a timing diagram of the signal on the first reset signal terminal. Re2 denotes a timing diagram of the signal on the second reset signal terminal.

The driving method of the pixel driving circuit in the present disclosure may include a reset phase t2, a data writing phase t4, and a light-emitting phase t6. In the reset phase t2: the second gate driving signal terminal G2 outputs a high level signal, the first reset signal terminal Re1 and the second reset signal terminal Re2 output a low level signal, the eighth transistor T8, the first transistor T1, the seventh transistor T7, and the ninth transistor T9 are turned on, the first initial signal terminal Vinit1 inputs a first initial signal to the gate of the driver transistor T3 through the first transistor T1 and the eighth transistor T8, the second initial signal terminal Vinit2 inputs a second initial signal to the first electrode of the light-emitting unit through the seventh transistor T7, and the third initial signal terminal Vinit3 inputs a third initial signal to the first electrode of the driver transistor T3 through the ninth transistor T9. In the data writing phase t4: the second gate driving signal terminal G2 outputs a high level signal, the first gate driving signal terminal G1 outputs a low level signal, the eighth transistor T8, the second transistor T2, and the fourth transistor T4 are turned on, and the data signal terminal Da outputs a data signal to write a compensation voltage Vdata+Vth to the gate of the driver transistor, wherein Vdata is a voltage of the data signal and Vth is a threshold voltage of the driver transistor T3. In the light-emitting phase t6: the enable signal terminal EM outputs a low level signal, the fifth transistor T5 and the sixth transistor T6 are turned on, and the driver transistor T3 drives the light-emitting unit OLED to emit light under the action of the voltage Vdata+Vth of the gate of the driver transistor T3. According to the driver transistor output current formula $I=(\mu WCox/2L)(Vgs-Vth)^2$, wherein u is a carrier mobility, Cox is a gate capacitance per unit area, W is a width of the driver transistor's channel, L is a length of the driver transistor's channel, Vgs is a voltage difference between the gate and the source of the driver transistor, and Vth is the threshold voltage of the driver transistor. The output current I of the driver transistor in the pixel driving circuit of the present disclosure equals to $(\mu WCox/2L)(Vdata+Vth-Vdd-Vth)^2$. Thus, the pixel driving circuit can avoid the effect of the threshold of the driver transistor on its output current.

In this exemplary embodiment, the display panel can reset the first electrode of the driver transistor T3 through the ninth transistor T9, and reset the gate of the driver transistor T3 through the eighth transistor T8 and the first transistor T1, so that the hysteresis of the driver transistor can be restored. In addition, by adding the eighth transistor T8, the display panel can reduce the leakage current from the gate of the driver transistor T3 through the first transistor T1, the second transistor T2.

As shown in FIG. 2, the driving method of the pixel driving circuit further includes a pre-reset phase t1, a hysteresis elimination phase t3, a re-reset phase t5, and a repeat reset phase t7. In the pre-reset phase t1: the second reset signal terminal Re2 outputs a low level signal, the ninth transistor T9 is turned on, and the third initial signal terminal Vinit3 pre-charges the third initial signal in advance to the first electrode of the driver transistor T3. This configuration can restore the hysteresis of the driver transistor T3 due to the bias voltage of the previous frame, thereby mitigating the display panel's residual image. In the re-reset phase t5: the second reset signal terminal Re2 outputs a low level signal, the ninth transistor T9 is turned on, and the third initial signal terminal Vinit3 provides the third initial signal to the first electrode of the driver transistor T3 again. This configuration can also restore the hysteresis of the driver transistor T3. In the repeat reset stage t7: the second reset signal terminal Re2 outputs a low level signal, the seventh transistor T7 is turned on, and the second initial signal terminal Vinit2 inputs a second initial signal to the first electrode of the light-emitting unit OLED to reset the first electrode of the light-emitting unit OLED. In one frame cycle, the driving method of the pixel driving circuit may include a plurality of repeat reset phases t7.

As shown in FIG. 2, the duration of the pre-reset phase t1 can be 12H; the duration between the rising edge of G2 in the reset phase t2 and the falling edge of G1 in the data writing phase t4 can be 8H; the duration of the data writing phase t4 can be less than H; and the duration of the repeat reset phase t7 can be 56H, where H is the duration of a unit cycle. In other exemplary embodiments, each phase may have other durations. For example, the duration of the reset phase t2 can be 1-3 times the duration of the data writing phase t4, such as 1-2 times, 2-3 times, etc. The duration of the re-reset phase t5 may be 1-5 times the duration of the data writing phase t4, such as 1-2 time, 2-3 times, 3-4 times, 4-5 times, etc. The voltage of the first initial signal can range from −2V to −5V, such as −2V, −3V, −4V, or −5V. The voltage of the second initial signal can also range from −2V to −5V, such as −2V, −3V, −4V, or −5V. The voltage of the third initial signal can range from 3V to 7V, such as 3V, 4V, 5V, 6V, or 7V.

Figure 3:
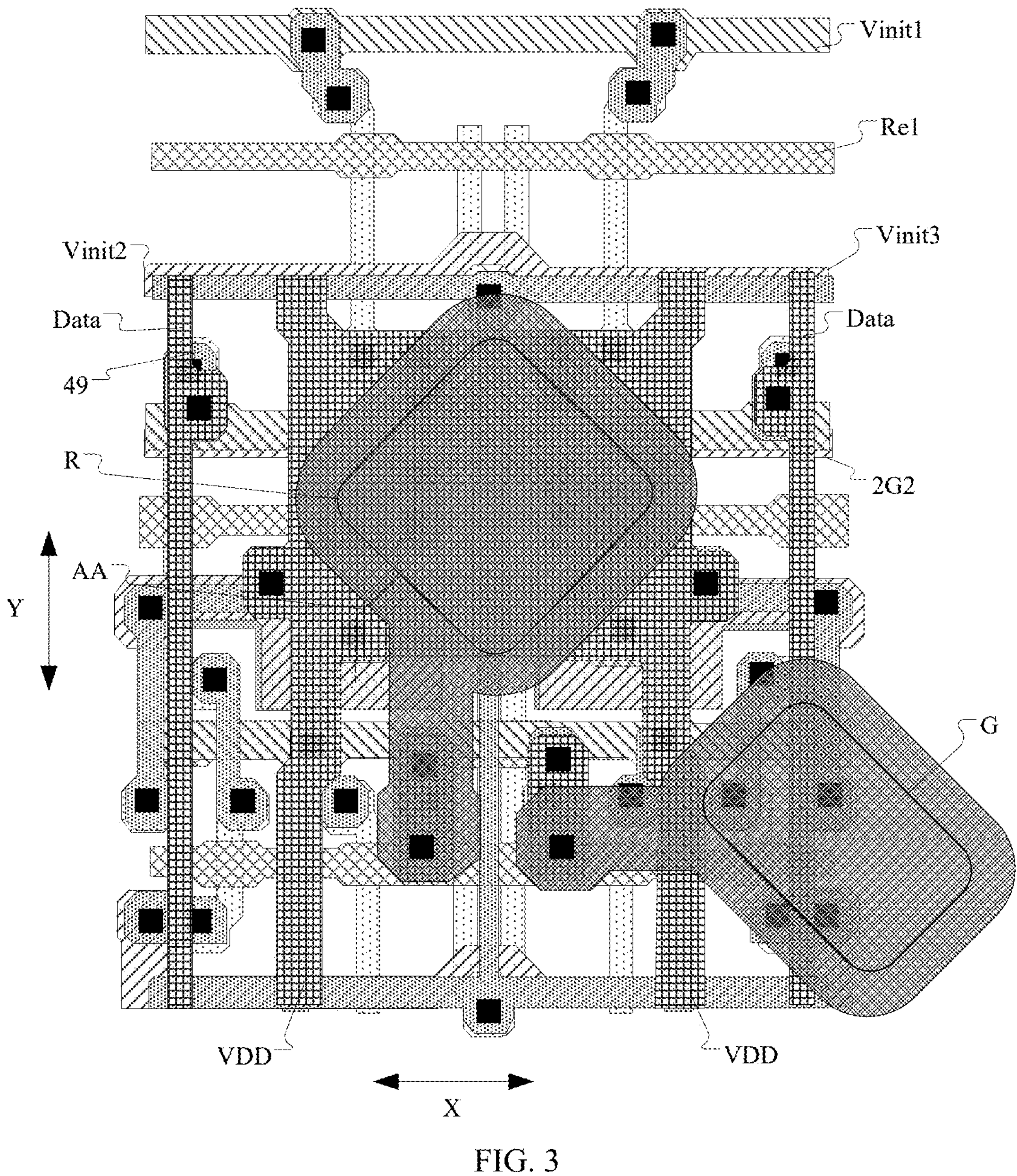
FIG. 3 is a structural layout of a display panel according to an exemplary embodiment of the present disclosure.
Figure 4:
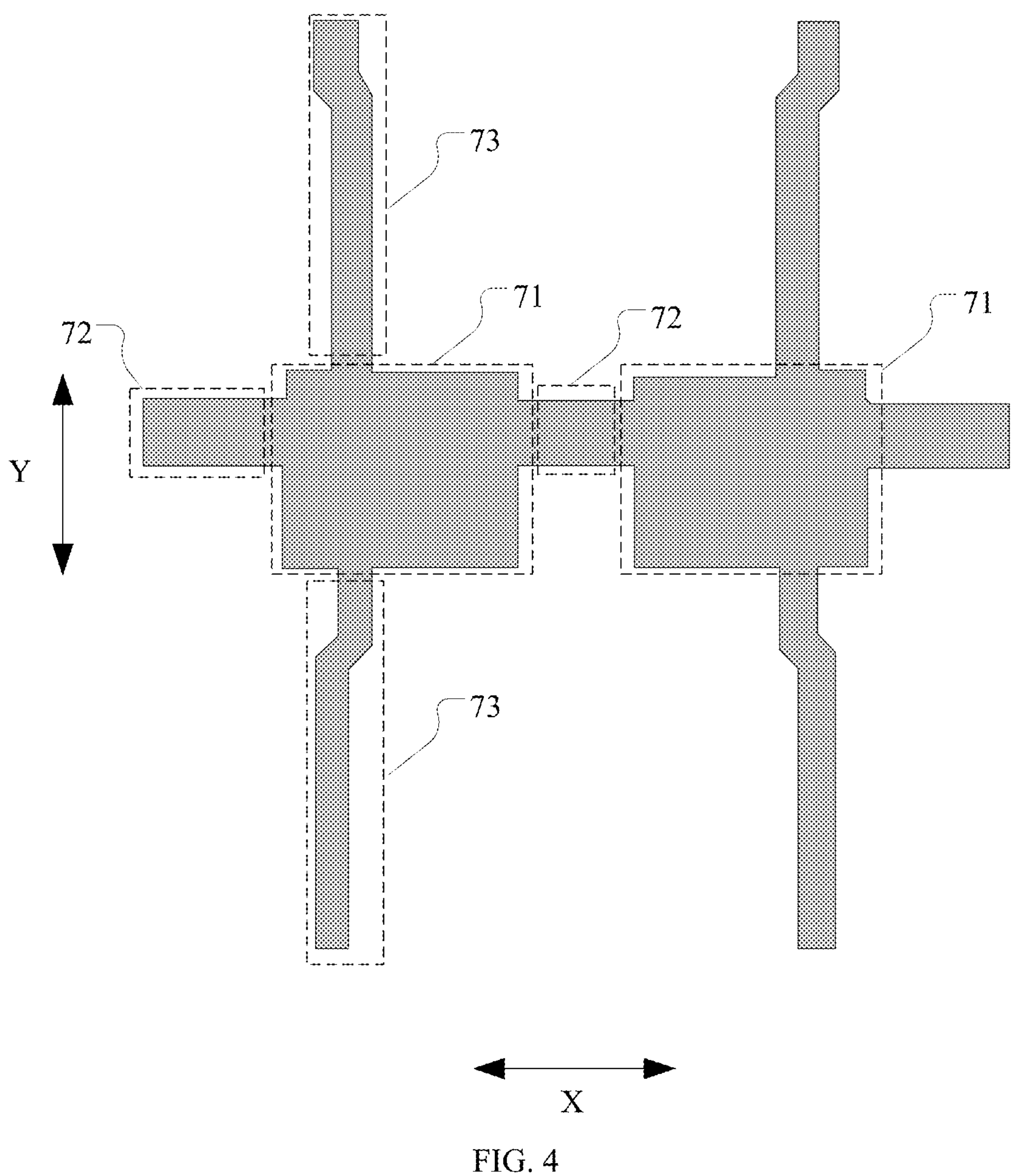
FIG. 4 is a structural layout of a shielding layer of FIG. 3.
Figure 5:
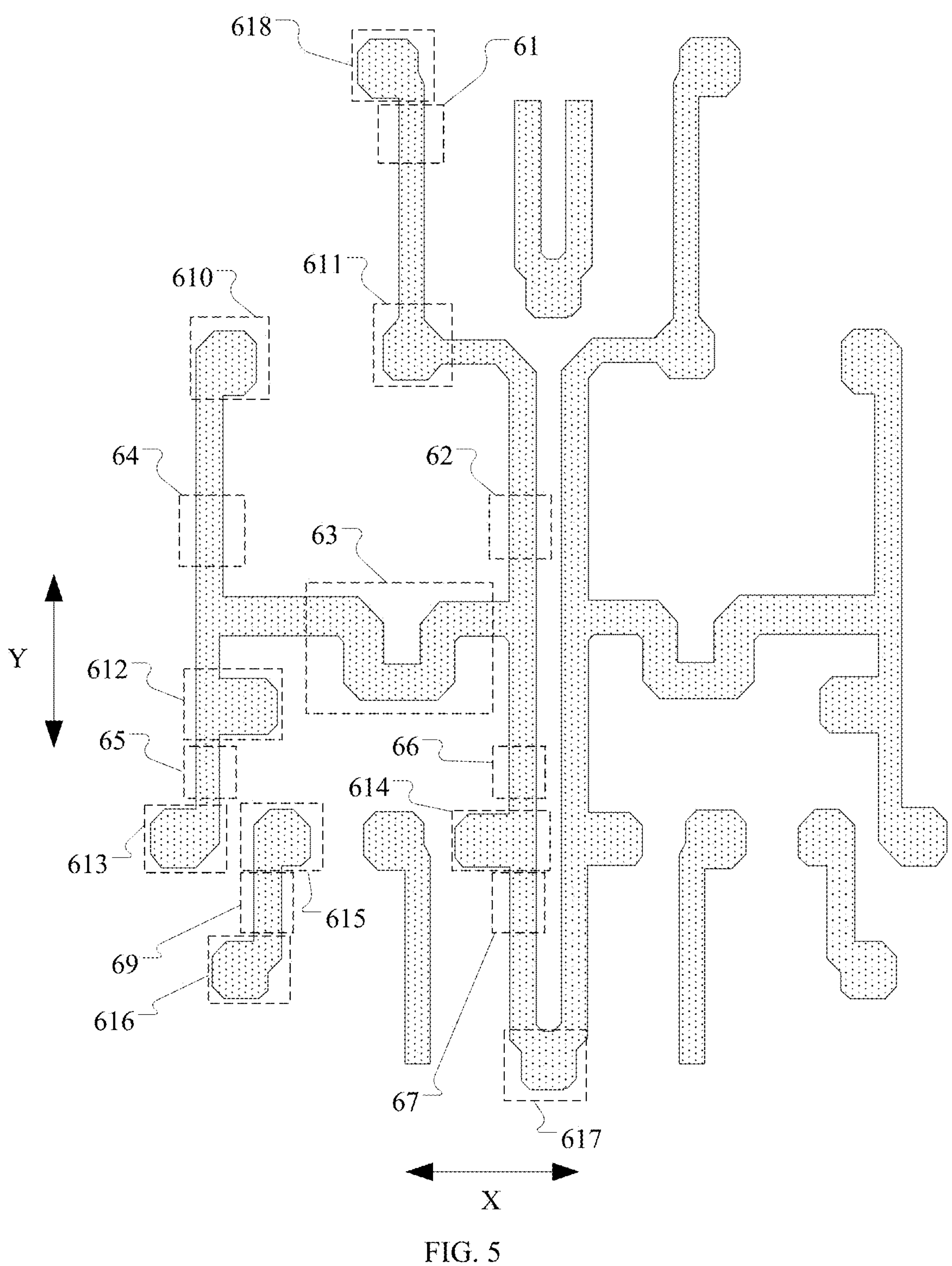
FIG. 5 is a structural layout of a first active layer of FIG. 3.
Figure 6:
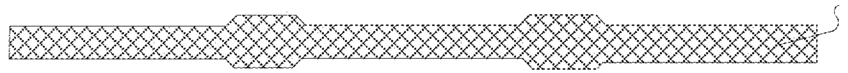
FIG. 6 is a structural layout of a first conductive layer of FIG. 3.
Figure 6:
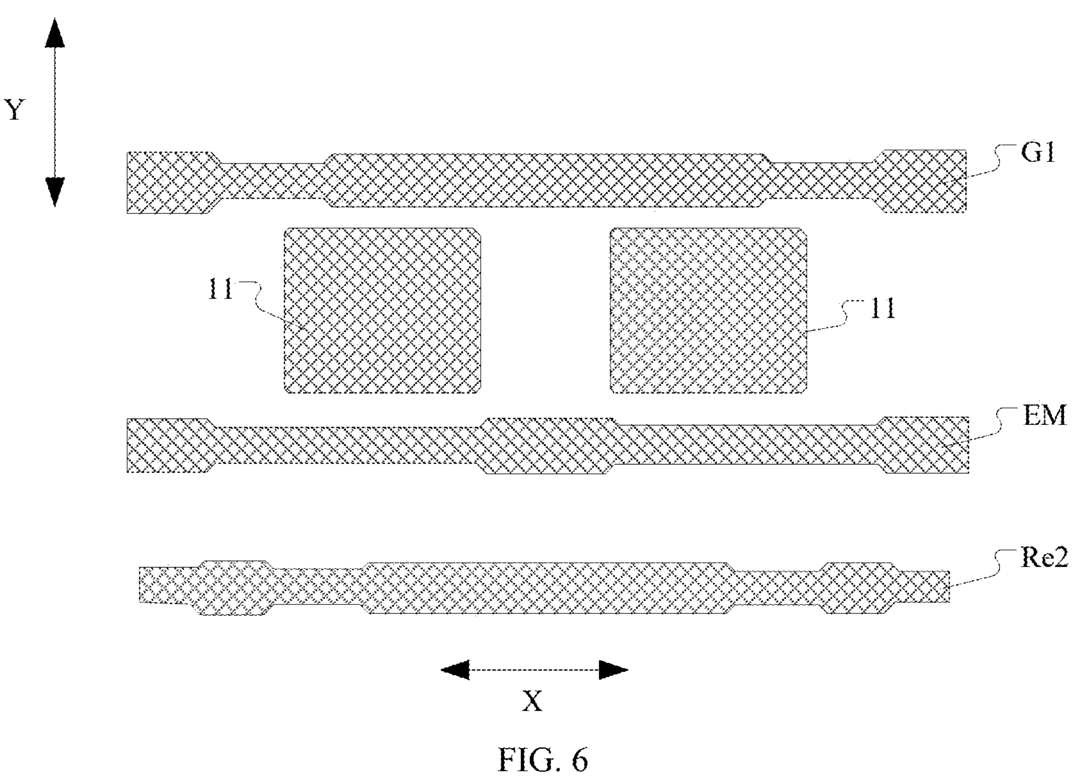
Figure 7:
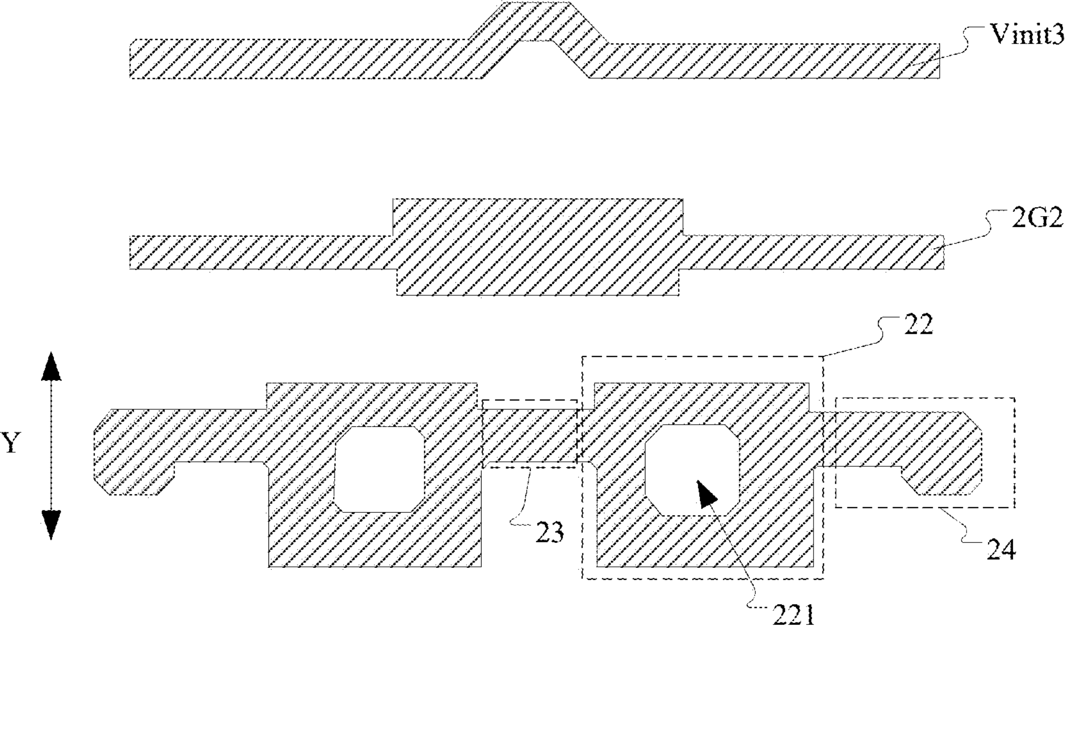
FIG. 7 is a structural layout of a second conductive layer of FIG. 3.
Figure 7:
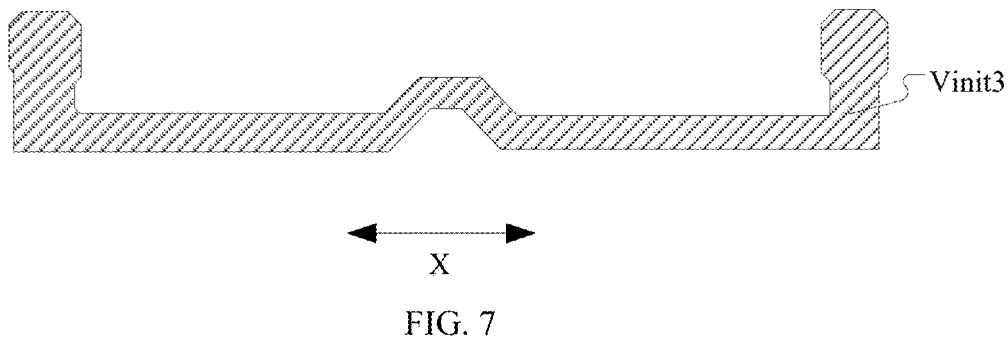
Figure 8:
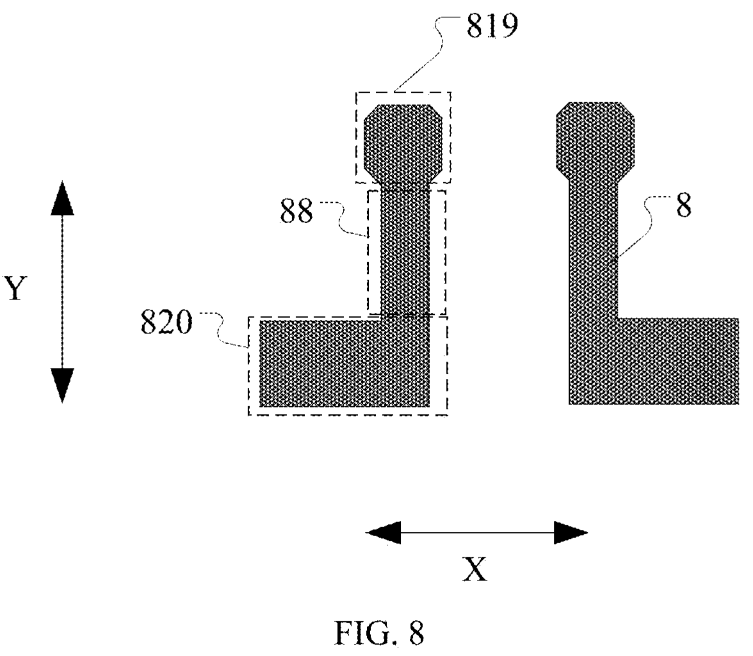
FIG. 8 is a structural layout of a second active layer of FIG. 3.
Figure 9:
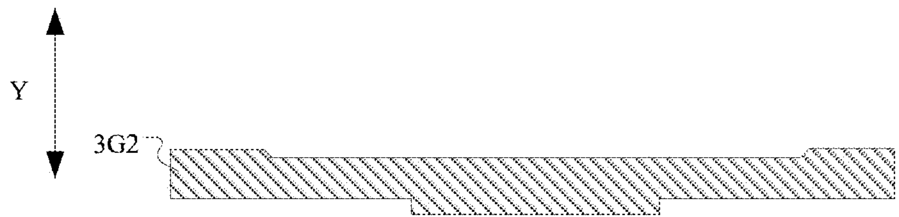
FIG. 9 is a structural layout of a third conductive layer of FIG. 3.
Figure 9:
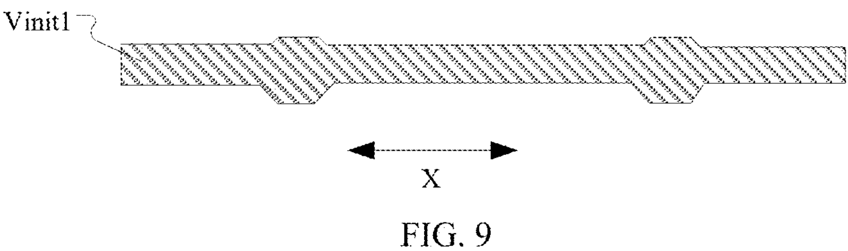
Figure 10:
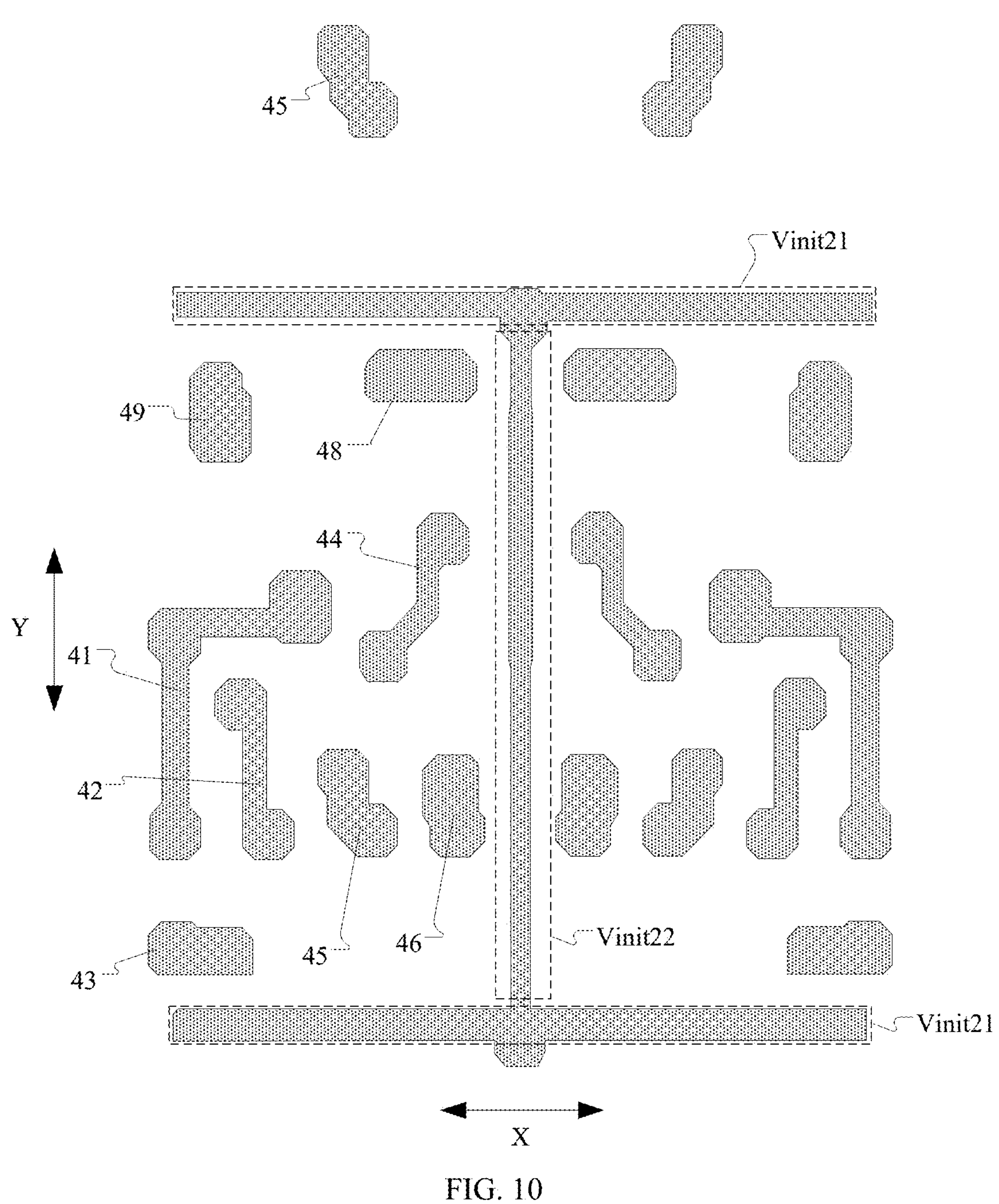
FIG. 10 is a structural layout of a fourth conductive layer of FIG. 3.
Figure 11:
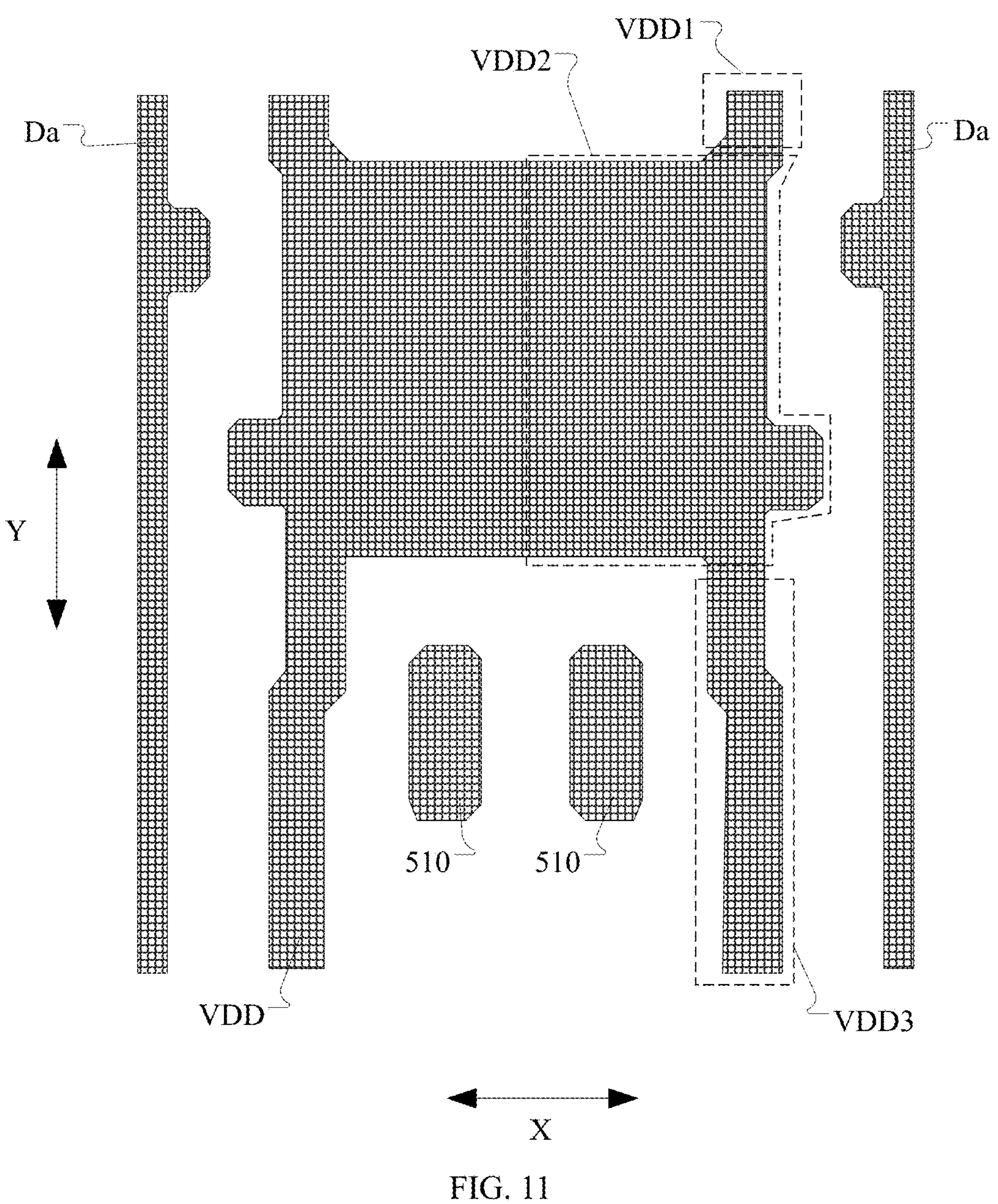
FIG. 11 is a structural layout of a fifth conductive layer of FIG. 3.
Figure 12:
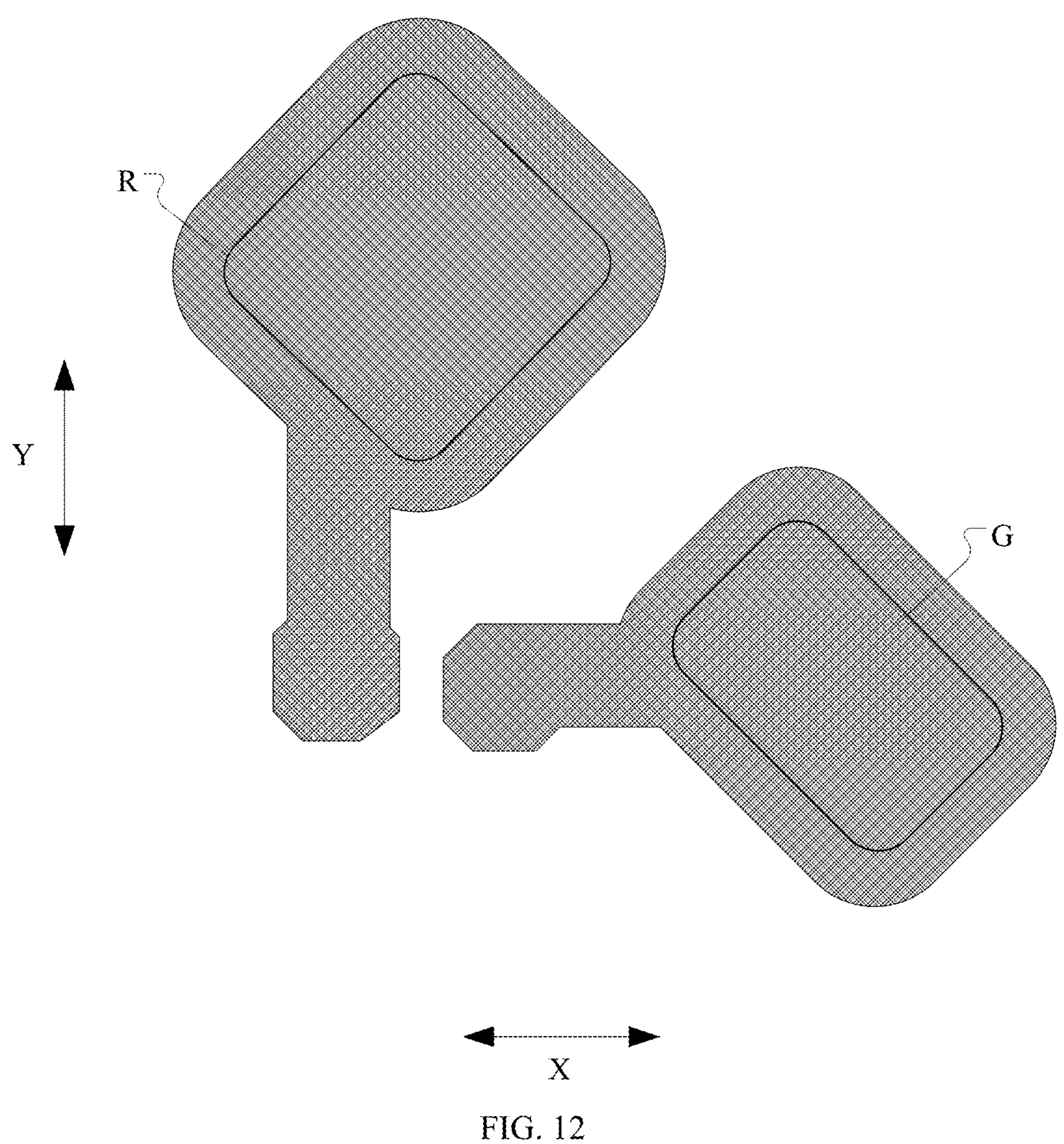
FIG. 12 is a structural layout of an electrode layer of FIG. 3.
Figure 13:
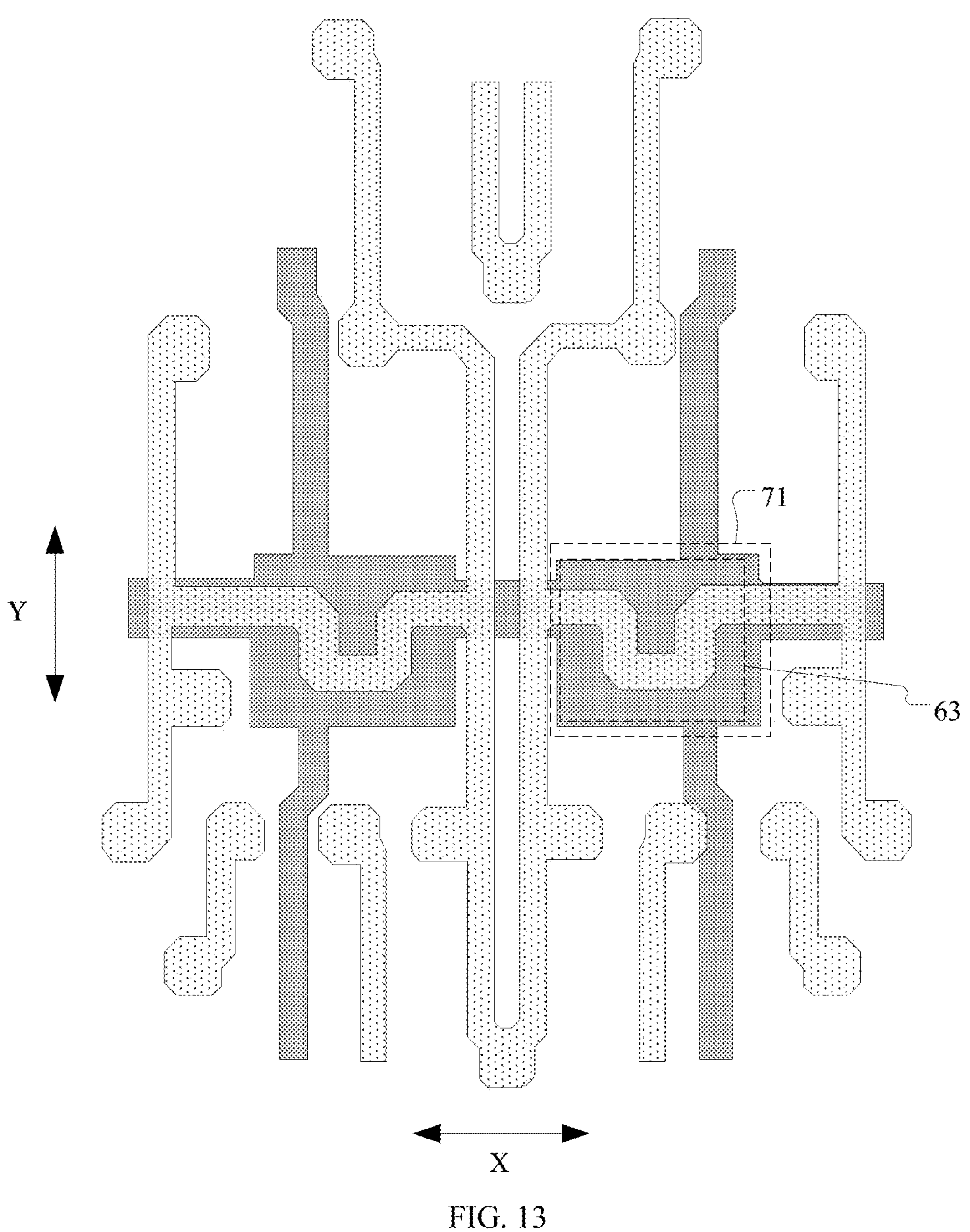
FIG. 13 is a structural layout of the shielding layer and the first active layer of FIG. 3.
Figure 14:
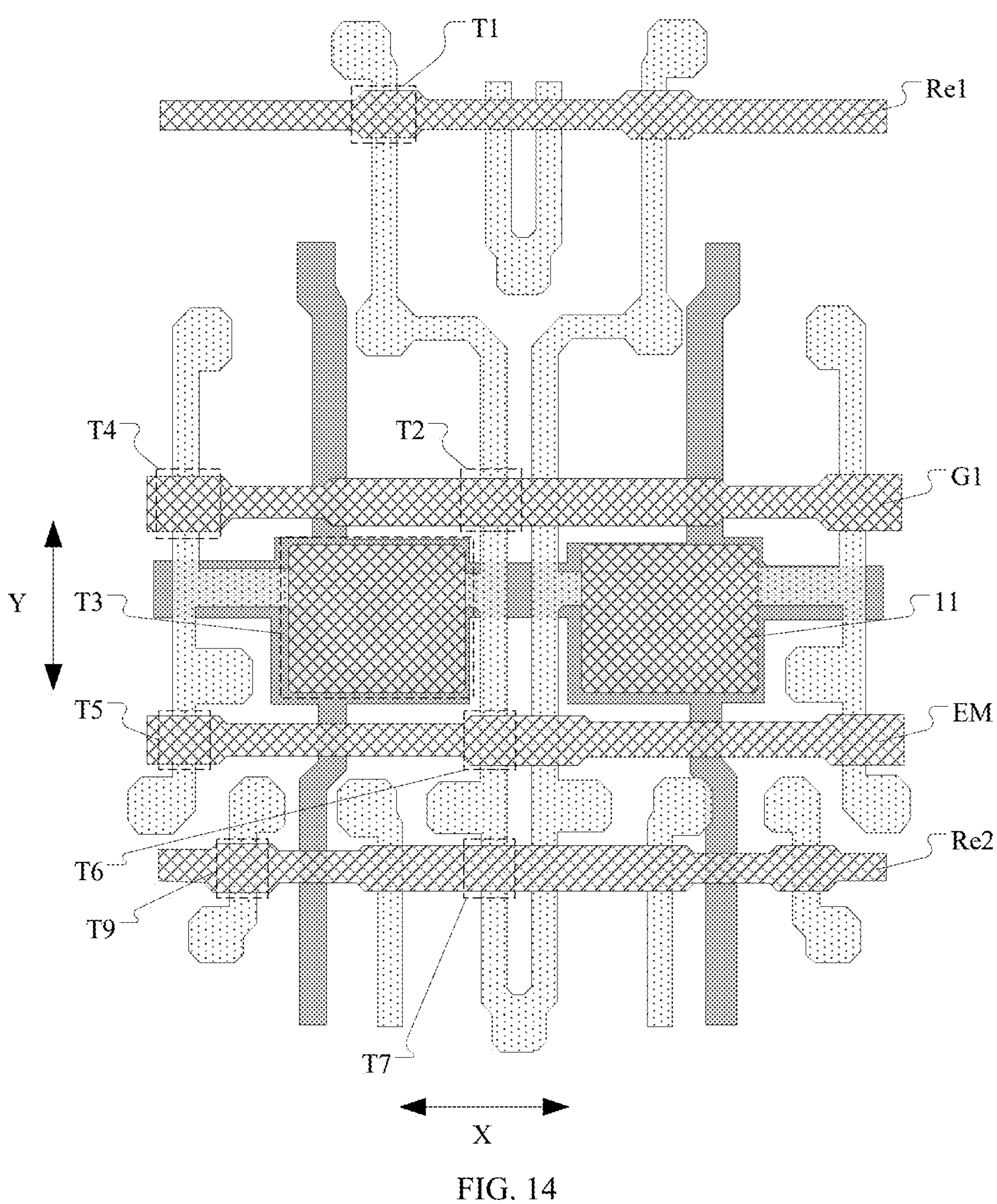
FIG. 14 is a structural layout of the shielding layer, the first active layer, and the first conductive layer of FIG. 3.
Figure 15:
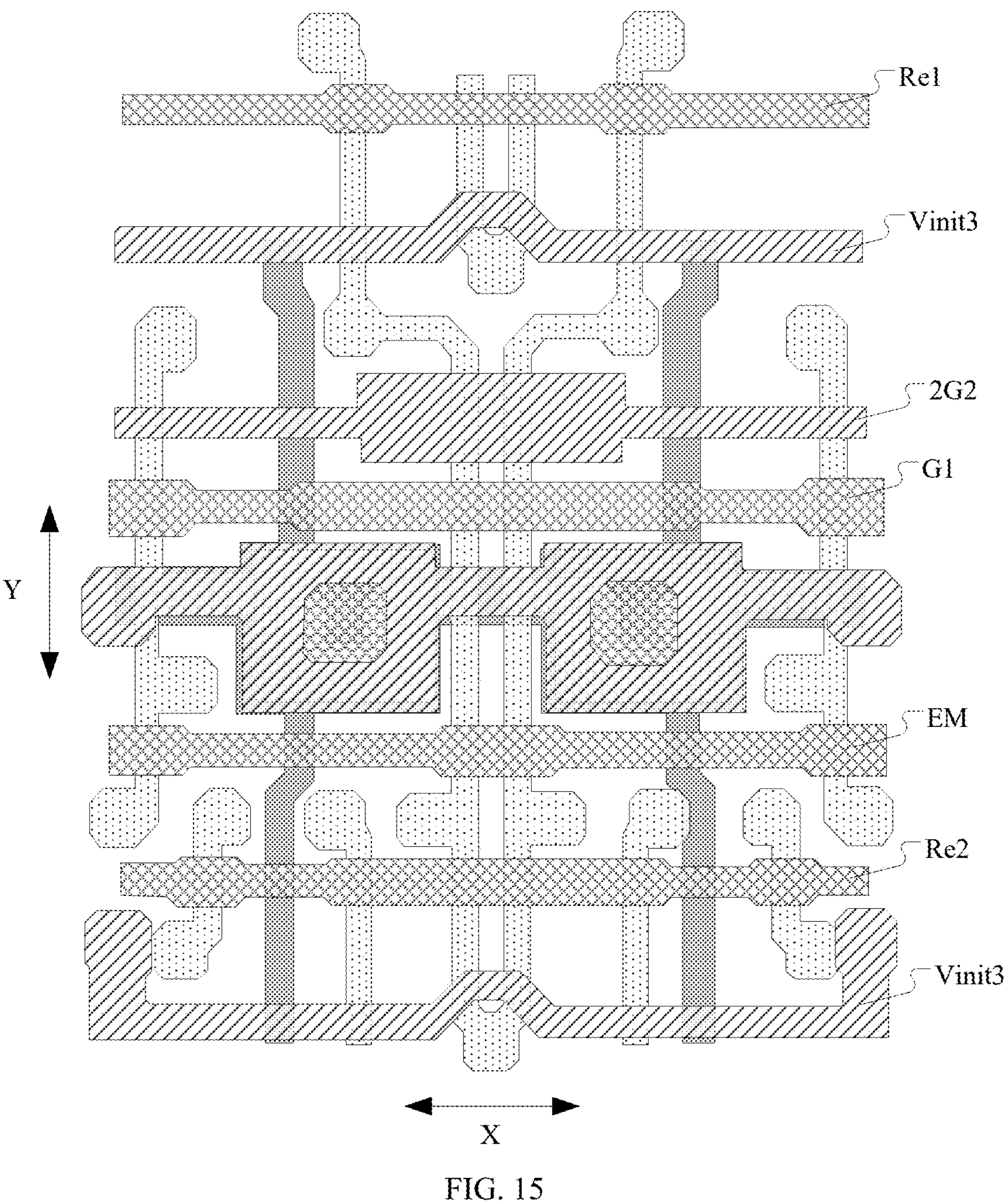
FIG. 15 is a structural layout of the shielding layer, the first active layer, the first conductive layer, and the second conductive layer of FIG. 3.
Figure 16:
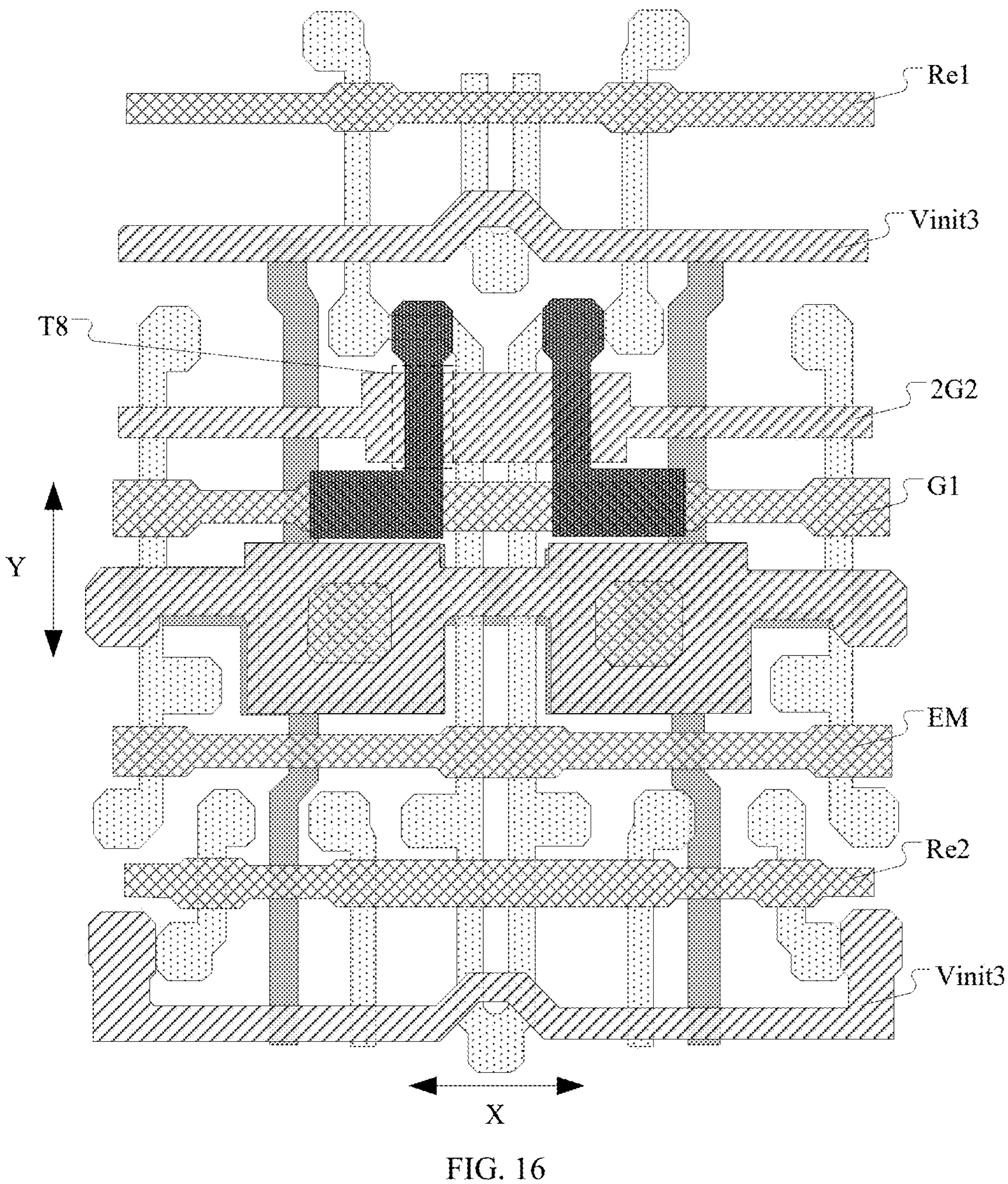
FIG. 16 is a structural layout of the shielding layer, the first active layer, the first conductive layer, the second conductive layer, and the second active layer of FIG. 3.
Figure 17:
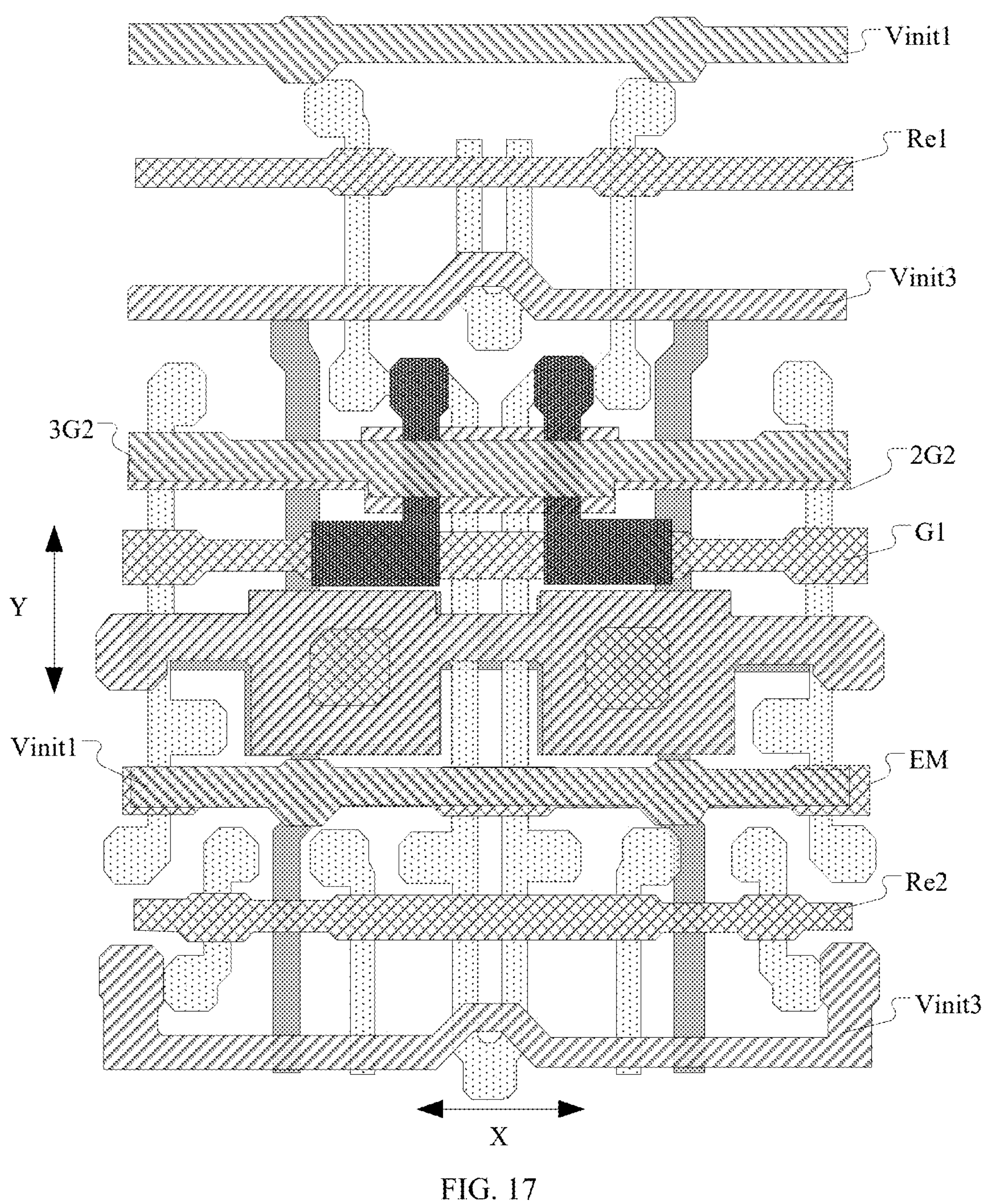
FIG. 17 is a structural layout of the shielding layer, the first active layer, the first conductive layer, the second conductive layer, the second active layer, and the third conductive layer of FIG. 3.
Figure 18:
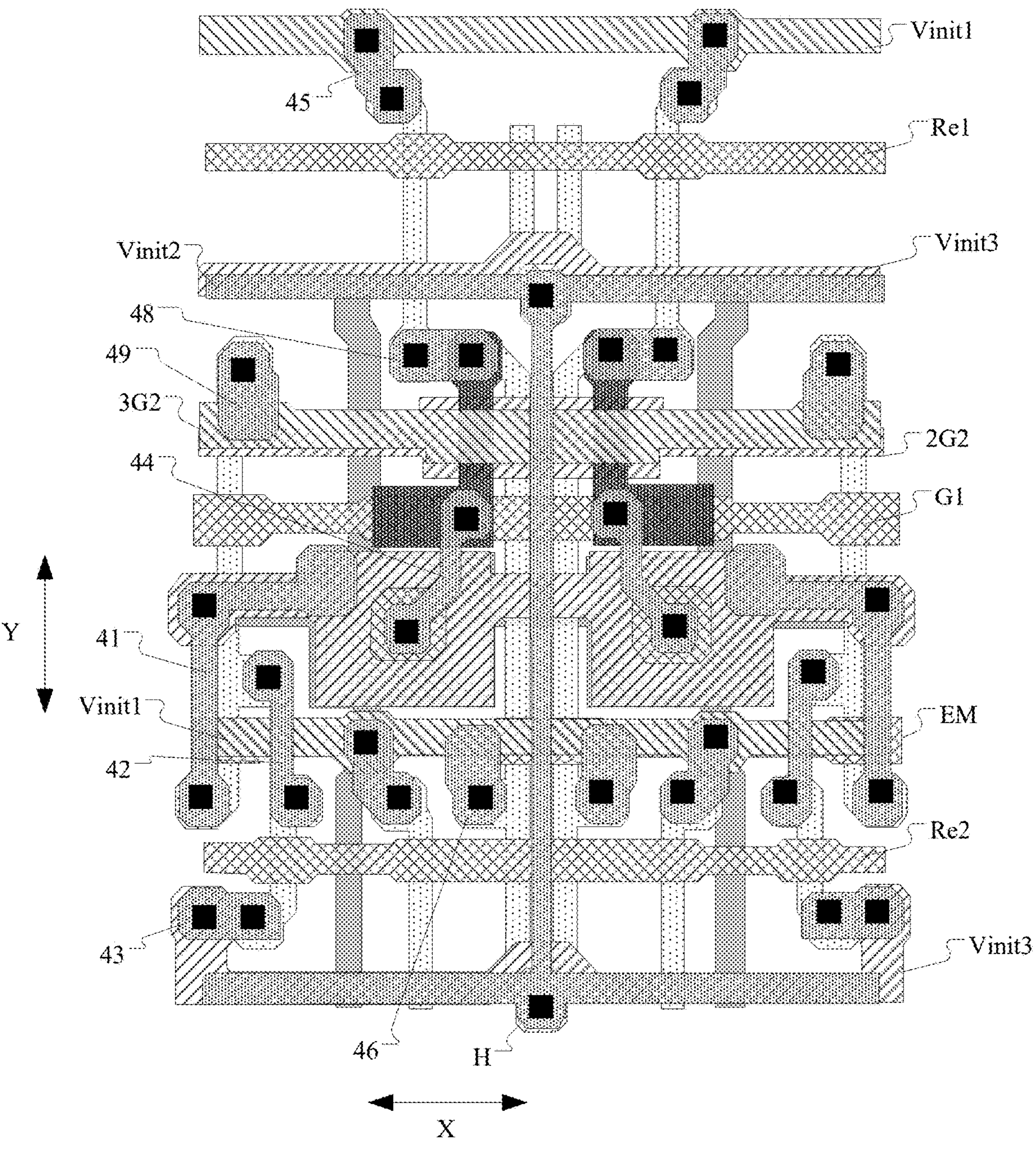
FIG. 18 is a structural layout of the shielding layer, the first active layer, the first conductive layer, the second conductive layer, the second active layer, the third conductive layer, and the fourth conductive layer of FIG. 3.
Figure 19:
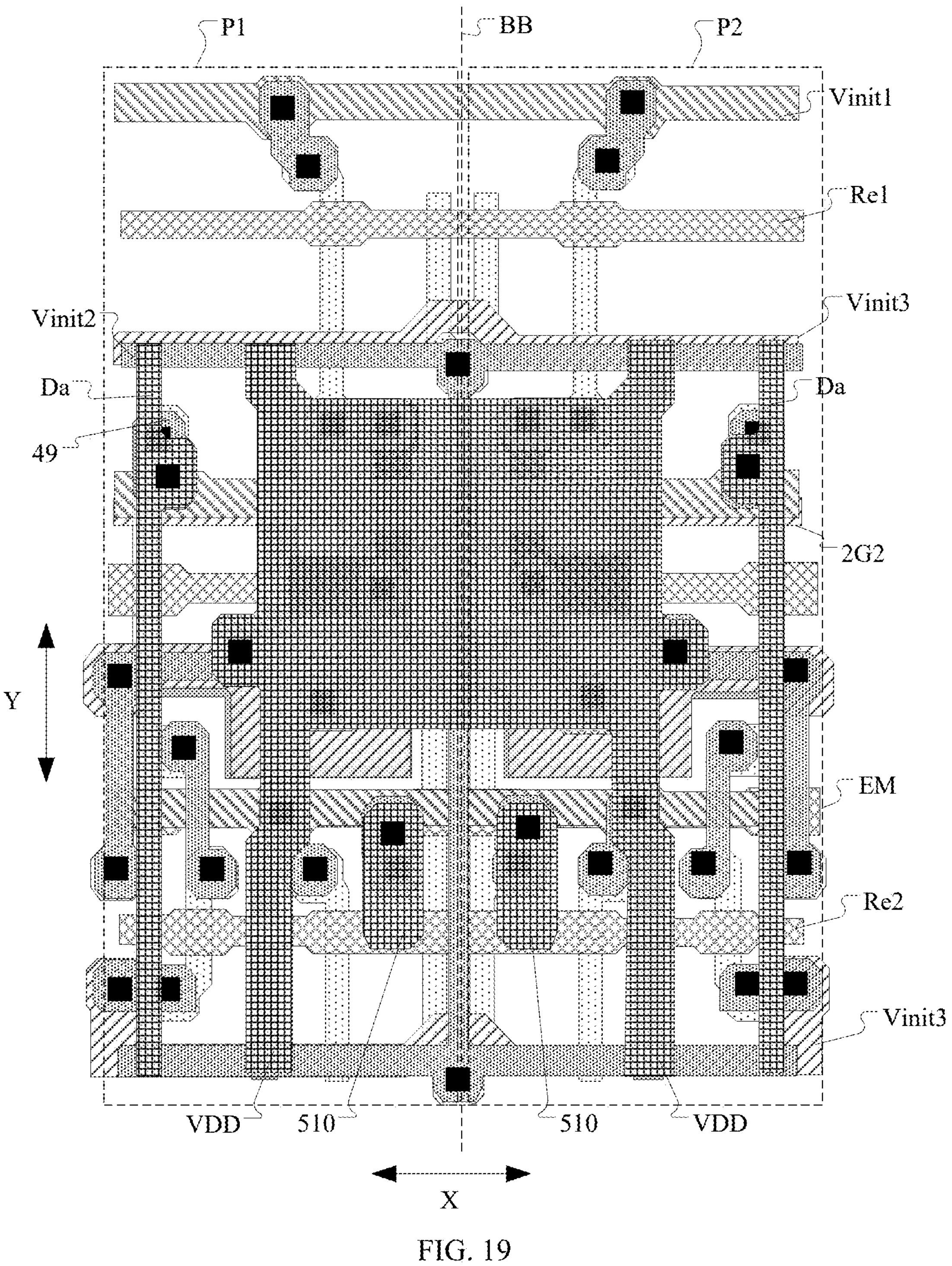
FIG. 19 is a structural layout of the shielding layer, the first active layer, the first conductive layer, the second conductive layer, the second active layer, the third conductive layer, the fourth conductive layer, and the fifth conductive layer of FIG. 3.

This exemplary embodiment also provides a display panel, which can include a substrate, a shielding layer, a first active layer, a first conductive layer, a second conductive layer, a second active layer, a third conductive layer, a fourth conductive layer, a fifth conductive layer, and an electrode layer, which are stacked in sequence. Insulating layers can be provided between the aforementioned adjacent layers. As shown in FIGS. 3-19, FIG. 3 is a structural layout of the display panel according to an exemplary embodiment of the present disclosure, FIG. 4 is a structural layout of the shielding layer in FIG. 3, FIG. 5 is a structural layout of the first active layer in FIG. 3, FIG. 6 is a structural layout of the first conductive layer in FIG. 3, FIG. 7 is a structural layout of the second conductive layer in FIG. 3, FIG. 8 is a structural layout of the second active layer in FIG. 3, FIG. 9 is a structural layout of the third conductive layer in FIG. 3, FIG. 10 is a structural layout of the fourth conductive layer in FIG. 3, FIG. 11 is a structural layout of the fifth conductive layer in FIG. 3, FIG. 12 is a structural layout of the electrode layer in FIG. 3, FIG. 13 is a structural layout of the shielding layer and the first active layer in FIG. 3, FIG. 14 is a structural layout of the shielding layer, the first active layer, and the first conductive layer in FIG. 3, FIG. 15 is a structural layout of the shielding layer, the first active layer, the first conductive layer, and the second conductive layer in FIG. 3, FIG. 16 is a structural layout of the shielding layer, the first active layer, the first conductive layer, the second conductive layer, and the second active layer in FIG. 3, FIG. 17 is a structural layout of the shielding layer, the first active layer, the first conductive layer, the second conductive layer, the second active layer, and the third conductive layer in FIG. 3, FIG. 18 is a structural layout of the shielding layer, the first active layer, the first conductive layer, the second conductive layer, the second active layer, the third conductive layer, and the fourth conductive layer in FIG. 3, and FIG. 19 is a structural layout of the shielding layer, the first active layer, the first conductive layer, the second conductive layer, the second active layer, the third conductive layer, the fourth conductive layer, and the fifth conductive layer of FIG. 3. The display panel can include a plurality of pixel driving circuits shown in FIG. 1. As shown in FIG. 19, the plurality of pixel driving circuits can include a first pixel driving circuit P1 and a second pixel driving circuit P2 disposed adjacent to each other in a first direction X. The first pixel driving circuit P1 and the second pixel driving circuit P2 can be disposed in mirror symmetry with respect to a mirror symmetry plane BB, wherein the mirror symmetry plane BB can be perpendicular to the substrate. Furthermore, an orthographic projection of the first pixel driving circuit P1 on the substrate and an orthographic projection of the second pixel driving circuit P2 on the substrate can be symmetrically with respect to an intersection line, serving as a symmetry axis, between the mirror symmetry plane BB and the substrate. The first pixel driving circuit P1 and the second pixel driving circuit P2 can form a repeatable unit, and the display panel can include a plurality of repeatable units distributed in an array in the first direction X and a second direction Y. The second direction Y can be intersected with the first direction X, for example, the first direction X can be a row direction and the second direction Y can be a column direction. The pixel driving circuit can include structures disposed in the shielding layer, the first active layer, the first conductive layer, the second conductive layer, the second active layer, the third conductive layer, the fourth conductive layer, and the fifth conductive layer. The pixel driving circuit does not include a structure disposed in the electrode layer. Furthermore, in this exemplary embodiment, the display panel may have design errors and process errors, and the first pixel driving circuit P1 and the second pixel driving circuit P2 may be mirror-symmetric substantially with respect to the mirror symmetry plane BB.

As shown in FIGS. 3, 4, and 13, the shielding layer can include a plurality of shielding portions 71, a first extension portion 73, and a second extension portion 72. An orthographic projection of the first extension portion 73 on the substrate extends along the second direction Y and the first extension portion 73 is connected between adjacent shielding portions 71 in the second direction Y. An orthographic projection of the second extension portion 72 on the substrate extends along the first direction X and the second extension portion 72 is connected between adjacent shielding portions 71 in the first direction X.

As shown in FIGS. 3, 5, 13, and 14, the first active layer can include a first active portion 61, a second active portion 62, a third active portion 63, a fourth active portion 64, a fifth active portion 65, a sixth active portion 66, a seventh active portion 67, and a ninth active portion 69. The first active portion 61 is used to form a channel region of the first transistor T1. The second active portion 62 is used to form a channel region of the second transistor T2. The third active portion 63 is used to form a channel region of the driver transistor T3. The fourth active portion 64 is used to form a channel region of the fourth transistor T4. The fifth active portion 65 is used to form a channel region of the fifth transistor T5. The sixth active portion 66 is used to form a channel region of the sixth transistor T6. The seventh active portion 67 is used to form a channel region of the seventh transistor T7. The ninth active portion 69 is used to form a channel region of the ninth transistor T9. In addition, the first active layer can include a tenth active portion 610, an eleventh active portion 611, a twelfth active portion 612, a thirteenth active portion 613, a fourteenth active portion 614, a fifteenth active portion 615, a sixteenth active portion 616, a seventeenth active portion 617, and an eighteenth active portion 618. The tenth active portion 610 is connected to an end, away from the third active portion 63, of the fourth active portion 64. The eleventh active portion 611 is connected between the first active portion 61 and the second active portion 62. The twelfth active portion 612 is connected between the third active portion 63 and the fifth active portion 65. The thirteenth active portion 613 is connected to an end, away from the third active portion 63, of the fifth active portion 65. The fourteenth active portion 614 is connected to the sixth active portion 66 and the seventh active portion 67. The fifteenth active portion 615 and the sixteenth active portion 616 are connected to two ends of the ninth active portion 69, respectively. The seventeenth active portion 617 is connected to an end, away from the sixth active portion 66, of the seventh active portion 67, and in the same repeatable unit, the seventh active portions 67 of two adjacent pixel driving circuits are connected through the same seventeenth active portion 617. The eighteenth active portion 618 is connected to an end, away from the second active portion 62, of the first active portion 61. An orthographic projection of the shielding portion 71 on the substrate can cover an orthographic projection of the third active portion 63 on the substrate, and the shielding portion 71 can shade the third active portion 63 to reduce the effect of light on the driving characteristics of the driver transistor T3. In addition, the shielding layer may be made of conductive materials. The shielding layer can also be connected to a stabilized voltage source to provide noise shielding for the driver transistor T3. For example, the shielding layer can be connected to the first power supply terminal VDD, the first initial signal terminal Vinit1, the second initial signal terminal Vinit2, the third initial signal terminal Vinit3, and the like. The first active layer can be formed from a polysilicon material, and accordingly, the first transistor T1, the second transistor T2, the driver transistor T3, the fourth transistor T4, the fifth transistor T5, the sixth transistor T6, the seventh transistor T7, and the ninth transistor T9 may be a low-temperature polycrystalline silicon thin-film transistor of the P-type.

As shown in FIGS. 3, 6, and 14, the first conductive layer can include a first reset signal line Re1, a first gate line G1, an enable signal line EM, a second reset signal line Re2, and a first conductive portion 11. The first reset signal line Re1 can be used to provide the first reset signal terminal in FIG. 1. An orthographic projection of the first reset signal line Re1 on the substrate can cover an orthographic projection of the first active portion 61 on the substrate, and a portion of the structure of the first reset signal line Re1 can be used to form the gate of the first transistor T1. The first gate line G1 can be used to provide the first gate driving signal terminal in FIG. 1. An orthographic projection of the first gate line G1 on the substrate can cover an orthographic projection of the second active portion 62 on the substrate and an orthographic projection of the fourth active portion 64 on the substrate. A portion of the structure of the first gate line G1 can be used to form the gate of the second transistor T2, and another portion of the structure of the first gate line G1 can be used to form the gate of the fourth transistor T4. The enable signal line EM is used to provide the enable signal terminal in FIG. 1. An orthographic projection of the enable signal line EM on the substrate can extend along the first direction X and cover an orthographic projection of the fifth active portion 65 on the substrate and an orthographic projection of the sixth active portion 66 on the substrate. A portion of the structure of the enable signal line EM can be used to form the gate of the fifth transistor T5, and another portion of the structure of the enable signal line EM can be used to form the gate of the sixth transistor T6. The second reset signal line Re2 is used to provide the second reset signal terminal in FIG. 1. An orthographic projection of the second reset signal line Re2 on the substrate can cover an orthographic projection of the seventh active portion 67 on the substrate and an orthographic projection of the ninth active portion 69 on the substrate. A portion of the structure of the second reset signal line Re2 can be used to form the gate of the seventh transistor T7, and another portion of the structure of the second reset signal line Re2 can be used to form the gate of the ninth transistor. An orthographic projection of the first conductive portion 11 on the substrate can cover an orthographic projection of the third active portion 63 on the substrate. The first conductive portion 11 can be used to form the gate of the driver transistor T3 and the first electrode of the capacitor C.

As shown in FIGS. 3, 6, and 14, the orthographic projection of the first reset signal line Re1 on the substrate, the orthographic projection of the first gate line G1 on the substrate, the orthographic projection of the first conductive portion 11 on the substrate, the orthographic projection of the enable signal line EM on the substrate, and the orthographic projection of the second reset signal line Re2 on the substrate can be sequentially distributed along the second direction Y. The first reset signal line Re1 in the pixel driving circuit of the current row can be reused as the second reset signal line Re2 in the pixel driving circuit of the adjacent upper row. This arrangement can improve the integration density of the pixel driving circuit in the second direction Y. In addition, the display panel can utilize the first conductive layer as a mask to conductive the first active layer, meaning that the areas of the first active layer covered by the first conductive layer can form the channel regions of transistors, while the areas of the first active layer not covered by the first conductive layer form conductive structures.

As shown in FIGS. 3, 7, and 15, the second conductive layer can include a third gate line 2G2, a third initial signal line Vinit3, and a second conductive portion 22. An orthographic projection of the third initial signal line Vinit3 on the substrate, and an orthographic projection of the third gate line 2G2 on the substrate can both extend in the first direction X. The third initial signal line Vinit3 is used to provide the third initial signal terminal in FIG. 1. The third gate line 2G2 is used to provide the second gate driving signal terminal in FIG. 1. An orthographic projection of the second conductive portion 22 on the substrate can overlap with the orthographic projection of the first conductive portion 11 on the substrate, and the second conductive portion 22 can be used to form the second electrode of the capacitor C. As shown in FIGS. 3, 7, and 15, the orthographic projection, on the substrate, of the third initial signal line Vinit3 in the pixel driving circuit of the adjacent upper row can be located between the orthographic projection, on the substrate, of the third gate line 2G2 in the pixel driving circuit of the current row and the orthographic projection, on the substrate, of the first reset signal line Re1 in the pixel driving circuit of the current row. This arrangement can further improve the integration density of the pixel driving circuit in the second direction Y. The second conductive layer can further include a first connection portion 23 and a second connection portion 24. The first connection portion 23 is connected between two adjacent second conductive portions 22 in the same repeatable unit. The second connection portion 24 is connected between two adjacent second conductive portions 22 in adjacent repeatable units in the first direction X.

As shown in FIGS. 3, 8, and 16, the second active layer can include a plurality of active sub-portions 8. The active sub-portion 8 includes an eighth active portion 88, a nineteenth active portion 819, and a twentieth active portion 820. The eighth active portion 88 is connected between the nineteenth active portion 819 and the twentieth active portion 820, and the eighth active portion 88 is used to form a channel region of the eighth transistor. An orthographic projection of the third gate line 2G2 on the substrate can cover an orthographic projection of the eighth active portion 88 on the substrate, and a portion of the structure of the third gate line 2G2 can be used to form a bottom gate of the eighth transistor T8. The second active layer can be formed from indium gallium zinc oxide, and accordingly, the eighth transistor T8 can be an N-type metal oxide thin film transistor.

As shown in FIGS. 3, 9, and 17, the third conductive layer can include a second gate line 3G2 and a first initial signal line Vinit1. An orthographic projection of the second gate line 3G2 on the substrate, and an orthographic projection of the first initial signal line Vinit1 on the substrate can both extend along the first direction X. The second gate line 3G2 is used to provide the second gate driving signal terminal in FIG. 1. The orthographic projection of the second gate line 3G2 on the substrate can cover the orthographic projection of the eighth active portion 88 on the substrate, and a portion of the structure of the second gate line 3G2 can be used to form a top gate of the eighth transistor T8. The second gate line 3G2 and the third gate line 2G2 in the pixel driving circuits of the same row can be connected by a via hole, and the via hole connected between the second gate line 3G2 and the third gate line 2G2 can be located in an edge wiring area other than the display area of the display panel. The first initial signal line Vinit1 can be used to provide the first initial signal terminal in FIG. 1. In this exemplary embodiment, the orthographic projection, on the substrate, of the first initial signal line Vinit1 in the pixel driving circuit of the adjacent next row can be located between the orthographic projection, on the substrate, of the first conductive portion 11 in the pixel driving circuit of the current row and the orthographic projection, on the substrate, of the second reset signal line Re2 in the pixel driving circuit of the current row. This arrangement can further improve the integration density of the pixel driving circuit in the second direction Y. In addition, the orthographic projection, on the substrate, of the first initial signal line Vinit1 in the pixel driving circuit of the adjacent next row can at least partially overlap with the orthographic projection, on the substrate, of the enable signal line EM in the pixel driving circuit of the current row. This arrangement can improve the transmittance of the display panel, thereby meeting the transmittance requirements of the display panel for optical under-display fingerprint sensing. In a first unit pixel, the area of the orthographic projection, on the substrate, of the first initial signal line Vinit1 in the pixel driving circuit of the adjacent next row is S1. In the same first unit pixel, the overlapping area between the orthographic projection, on the substrate, of the first initial signal line Vinit1 in the pixel driving circuit of the adjacent next row and the orthographic projection, on the substrate, of the enable signal line EM in the pixel driving circuit of the current row is S2. The ratio S2/S1 can be greater than 60%, for example, S2/S1 can be equal to 60%, 70%, 80%, 90%, 100%, etc. The first unit pixel includes two rows and n columns of pixel driving circuits, where n is a positive integer greater than or equal to 1, and the two rows of pixel driving circuits in the first unit pixel are adjacent to each other. For example, the first unit pixel can include two rows and one column of pixel driving circuits. Another example is that the first unit pixel can include two full rows of pixel driving circuits located in the display area. Additionally, the display panel can utilize the third conductive layer as a mask to conductive the second active layer, meaning that the areas of the second active layer covered by the third conductive layer can form the channel regions of transistors, while the areas of the second active layer not covered by the third conductive layer form conductive structures.

As shown in FIGS. 3, 9, and 17, in the same pixel driving circuit and in the first direction X, the orthographic projection of the second active portion 62 on the substrate is located on a side, away from the orthographic projection of the first extension portion 73 on the substrate, of the orthographic projection of the eighth active portion 88 on the substrate. This arrangement allows the second active portion 62 to be located away from the first extension portion 73, so that changes in the crystallization state of the first active layer and the risk of tunneling caused by the edge morphology of the first extension portion 73 can be avoided. It should be understood that in other exemplary embodiments, in the same pixel driving circuit and in the first direction X, the orthographic projection of the second active portion 62 on the substrate may also be located between the orthographic projection of the eighth active portion 88 on the substrate and the orthographic projection of the first extension portion 73 on the substrate.

As shown in FIGS. 3, 9, and 17, the minimum distance between the orthographic projection of the first active portion 61 on the substrate and the orthographic projection of the shielding layer on the substrate is L3. The size of the orthographic projection of the first active portion 61 on the substrate in the first direction X is L4. L3 can be greater than or equal to L4. For example, L3 can be 1 time, 2 times, 3 times, 4 times, etc., of L4. The minimum distance between the orthographic projection of the ninth active portion 69 on the substrate and the orthographic projection of the shielding layer on the substrate is L5. The size of the orthographic projection of the ninth active portion 69 on the substrate in the first direction X is L6, and L5 can be greater than or equal to L6. For example, L5 can be 1 time, 2 times, 3 times, 4 times, etc., of L6. The minimum distance between the orthographic projection of the second active portion 62 on the substrate and the orthographic projection of the shielding layer on the substrate is L7. The size of the orthographic projection of the second active portion 62 on the substrate in the first direction X is L8, and L7 can be greater than or equal to L8. For example, L7 can be 1 time, 2 times, 3 times, 4 times, etc., of L8. The minimum distance between the orthographic projection of the fourth active portion 64 on the substrate and the orthographic projection of the shielding layer on the substrate is L9. The size of the orthographic projection of the fourth active portion 64 on the substrate in the first direction X is L10, and L9 can be greater than or equal to L10. For example, L9 can be 1 time, 2 times, 3 times, 4 times, etc., of L10. The minimum distance between the orthographic projection of the fifth active portion 65 on the substrate and the orthographic projection of the shielding layer on the substrate is L11. The size of the orthographic projection of the fifth active portion 65 on the substrate in the first direction X is L12, and L11 can be greater than or equal to L12. For example, L11 can be 1 time, 2 times, 3 times, 4 times, etc., of L12. The minimum distance between the orthographic projection of the sixth active portion 66 on the substrate and the orthographic projection of the shielding layer on the substrate is L13. The size of the orthographic projection of the sixth active portion 66 on the substrate in the first direction X is L14, and L13 can be greater than L14. For example, L13 can be 1 time, 2 times, 3 times, 4 times, etc., of L14. The minimum distance between the orthographic projection of the seventh active portion 67 on the substrate and the orthographic projection of the shielding layer on the substrate is L15. The size of the orthographic projection of the seventh active portion 67 on the substrate in the first direction X is L16, and L15 can be greater than or equal to L16. For example, L15 can be 1 time, 2 times, 3 times, 4 times, etc., of L16.

As shown in FIGS. 3, 10, and 18, the fourth conductive layer can include a second initial signal line Vinit2, a first bridging portion 41, a second bridging portion 42, a third bridging portion 43, a fourth bridging portion 44, a fifth bridging portion 45, a sixth bridging portion 46, a seventh bridging portion 47, an eighth bridging portion 48, and a ninth bridging portion 49. The second initial signal line Vinit2 can be used to provide the second initial signal terminal of FIG. 1. The second initial signal line Vinit2 can include first initial signal sub-lines Vinit21 and a second initial signal sub-line Vinit22, where an orthographic projection of the first initial signal sub-line Vinit21 on the substrate can extend in the first direction X, and an orthographic projection of the second initial signal sub-line Vinit22 on the substrate can extend in the second direction Y. The intersecting first initial signal sub-lines Vinit21 and the second sub-initial signal line Vinit22 are connected. The second initial signal line Vinit2 can be connected to the seventeenth active portion 617 through a via hole H to connect the first electrode of the seventh transistor T7 and the second initial signal terminal, and the seventeenth active portion 617 is connected between adjacent seventh active portions 67. This arrangement can improve the integration density of the pixel driving circuit in the first direction, and at the same time to reduce the number of via holes. In the figures, the black square indicates the position of the via hole. In this exemplary embodiment, each row of pixel driving circuits can be provided with one first initial signal sub-line Vinit21 correspondingly, each column of repeatable units can be provided with one second initial signal sub-line Vinit22 correspondingly, and a plurality of first initial signal sub-lines Vinit21 and a plurality of second initial signal sub-lines Vinit22 can form a grid structure. The second initial signal lines Vinit2 in the grid structure have a lower resistance, thereby reducing a voltage difference between the second initial signal terminals at different positions on the display panel. In this exemplary embodiment, as shown in FIG. 19, an orthographic projection of the mirror symmetry plane on the substrate can be located on the orthographic projection of the second initial signal sub-line Vinit22 on the substrate. It should be understood that in other exemplary embodiments, the second initial signal line Vinit2 may have other arrangements. For example, a plurality of rows of pixel driving circuits can be provided with one first initial signal sub-line Vinit21 correspondingly and/or a plurality of columns of repeatable units can be provided with one second initial signal sub-line Vinit22 correspondingly. For another example, the second initial signal line Vinit2 can only include the first initial signal sub-line Vinit21 or the second initial signal sub-line Vinit22. The first bridging portion 41 can be connected to the thirteenth active portion 613 and the second connection portion 24 through via holes, respectively, to connect the first electrode of the fifth transistor T5 to the second electrode of the capacitor C. In two repeatable units adjacent to each other in the first direction X, two adjacent pixel driving circuits can share the same first bridging portion 41 and can be connected to the second connection portion 24 through the same via hole using the shared first bridging portion 41. In addition, in two repeatable units adjacent to each other in the first direction X, the fifth active portions 65 in two adjacent pixel driving circuits can be connected through the thirteenth active portion 613, which can improve the integration density of the display panel in the first direction, and at the same time, the thirteenth active portion 613 can be connected to the first bridging portion 41 through a single via hole to reduce the number of via holes. The second bridging portion 42 can be connected to the twelfth active portion 612 and the fifteenth active portion 615 through via holes, respectively, to connect the second electrode of the ninth transistor T9 and the first electrode of the driver transistor. The third bridging portion 43 can be connected to the sixteenth active portion 616 and the third initial signal line Vinit3 through via holes, respectively, to connect the first electrode of the ninth transistor T9 and the third initial signal terminal. The fourth bridging portion 44 can be connected to the first conductive portion 11 and the twentieth active portion 820 through via holes, respectively, to connect the gate of the driver transistor T3 and the first electrode of the eighth transistor T8. As shown in FIG. 7, an opening 221 is formed in the second conductive portion 22, and an orthographic projection, on the substrate, of the via hole connected between the first conductive portion 11 and the fourth bridging portion 44 is disposed within an orthographic projection, on the substrate, of the opening 221 to insulate the via hole connected between the first conductive portion 11 and the fourth bridging portion 44 from the second conductive portion 22. The fifth bridging portion 45 can be connected to the eighteenth active portion 618 and the first initial signal line Vinit1 through via holes, respectively, to connect the first electrode of the first transistor T1 and the first initial signal terminal. The sixth bridging portion 46 can be connected to the fourteenth active portion 614 through a via hole, to connect the second electrode of the sixth transistor T6 and the second electrode of the seventh transistor T7. The eighth bridging portion 48 can be connected to the nineteenth active portion 819 and the eleventh active portion 611 through via holes, respectively, to connect the second electrode of the eighth transistor T8, the second electrode of the first transistor, and the first electrode of the second transistor. The ninth bridging portion 49 is connected to the tenth active portion 610 through a via hole, to be connected to the first electrode of the fourth transistor.

As shown in FIGS. 3, 8, 17, and 18, in this exemplary embodiment, the first gate line G1 is disposed between the first conductive portion 11 and the second gate line 3G2, so that the coupling effect between the first gate line G1 and the first conductive portion 11 can be enhanced, and thus, at the end of the data writing phase, the voltage of the first gate line G1 increases, which can pull up the voltage at the gate of the driver transistor T3. This arrangement can reduce the voltage of the data signal in the black screen mode of the display panel, thereby reducing the power consumption of the display panel. In this exemplary embodiment, an orthographic projection of the twentieth active portion 820 on the substrate and the orthographic projection of the first gate line G1 on the substrate are at least partially overlapped. Thus, at the end of the data writing phase, the first gate line G1 can pull up the voltage of the gate of the driver transistor T3 through the twentieth active portion 820. This arrangement can further reduce the voltage of the data signal in the black screen mode of the display panel, thereby reducing the power consumption of the display panel. As shown in FIG. 8, the orthographic projection of the twentieth active portion 820 on the substrate can extend along the first direction X. The size of the orthographic projection of the twentieth active portion 820 on the substrate in the first direction X can be greater than the size of the orthographic projection of the twentieth active portion 820 on the substrate in the second direction Y. In this exemplary embodiment, the size of the orthographic projection of the eighth active part 88 on the substrate in the first direction is L1, and the size of the orthographic projection of the twentieth active portion 820 on the substrate in the first direction is L2, where the ratio L2/L1 Substitute Specification and Abstract is greater than or equal to 2 and is less than or equal to 7. For example, L2/L1 can be equal to 2, 3, 4, 5, 6, 7, and the like.

As shown in FIGS. 3, 10, and 18, the orthographic projection of the first initial signal sub-line Vinit21 on the substrate can be at least partially overlapped with the orthographic projection of the third initial signal line Vinit3 on the substrate. This arrangement can improve the transmittance of the display panel. For example, in a second unit pixel, an area of the orthographic projection of the first sub-initial signal line Vinit21 on the substrate can be S3, and an overlapping area between the orthographic projection of the first initial signal sub-line Vinit21 on the substrate and the orthographic projection of the third initial signal line Vinit3 on the substrate is S4. The ratio S4/S3 can be greater than or equal to 50%. For example, S4/S3 can be 50%, 60%, 70%, 80%, 90%, 100%, etc. The second unit pixel includes a row of m column pixel driving circuits, where m is a positive integer greater than or equal to 1. For example, the second unit pixel can include a single row and a single column of pixel driving circuits. For another example, the second unit pixel can include an entire row of pixel driving circuits located in the display area.

As shown in FIGS. 3, 11, and 19, the fifth conductive layer can include a data line Da, a power line VDD, and a tenth bridging portion 510. The data line Da can be used to provide the data signal terminal of FIG. 1, and the power line VDD can be used to provide the first power terminal of FIG. 1. An orthographic projection of the data line Da on the substrate and an orthographic projection of the power line VDD on the substrate can extend in the second direction Y. The data line Da can be connected to the ninth bridging portion 49 through a via hole, to connect the first electrode of the fourth transistor T4 and the data signal terminal. Each column of pixel driving circuits can be provided with one power line VDD correspondingly, and the power line VDD can be connected to the first bridging portion 41 through a via hole, to connect the first power supply terminal, the second electrode of the capacitor C, and the first electrode of the fifth transistor T5. In this exemplary embodiment, the power line VDD can include a first power line segment VDD1, a second power line segment VDD2, and a third power line segment VDD3. The second power line segment VDD2 is connected between the first power line segment VDD1 and the third power line segment VDD3. The size of the orthographic projection, on the substrate, of the second power line segment VDD2 in the first direction X can be greater than the size of the orthographic projection, on the substrate, of the first power line segment VDD1 in the first direction X, and the size of the orthographic projection, on the substrate, of the second power line segment VDD2 in the first direction X can be greater than the size of the orthographic projection, on the substrate, of the third power line segment VDD3 in the first direction X. In addition, the orthographic projection of the second power line segment VDD2 on the substrate can also cover the orthographic projection of the eighth active portion 88 on the substrate, thus the second power line segment VDD2 can reduce the effect of light on the characteristics of the eighth transistor T8. In addition, the orthographic projection of the power line VDD on the substrate can also cover the orthographic projection of the twentieth active portion 820 on the substrate, and the orthographic projection of the fourth bridging portion 44 on the substrate, thus the power line VDD can be used to shield other signals from noise interference on the twentieth active portion 820 and the fourth bridging portion 44, so as to improve the stability of the gate voltage of the driver transistor T3. The tenth bridging portion 510 can be connected to the sixth bridging portion 46 through a via hole, to be connected to the second electrode of the sixth transistor T6.

As shown in FIGS. 3, 11, and 19, in this exemplary embodiment, two adjacent second power line segments VDD2, in the same repeatable unit, can be connected to each other. The power line VDD and the second conductive portion 22 connected in the first direction X can form a grid structure, which has a lower resistance of the power line, so that the voltage difference between the first power supply terminals at different positions on the display panel can be reduced, thereby improving the uniformity of the display panel's display.

Figure 20:
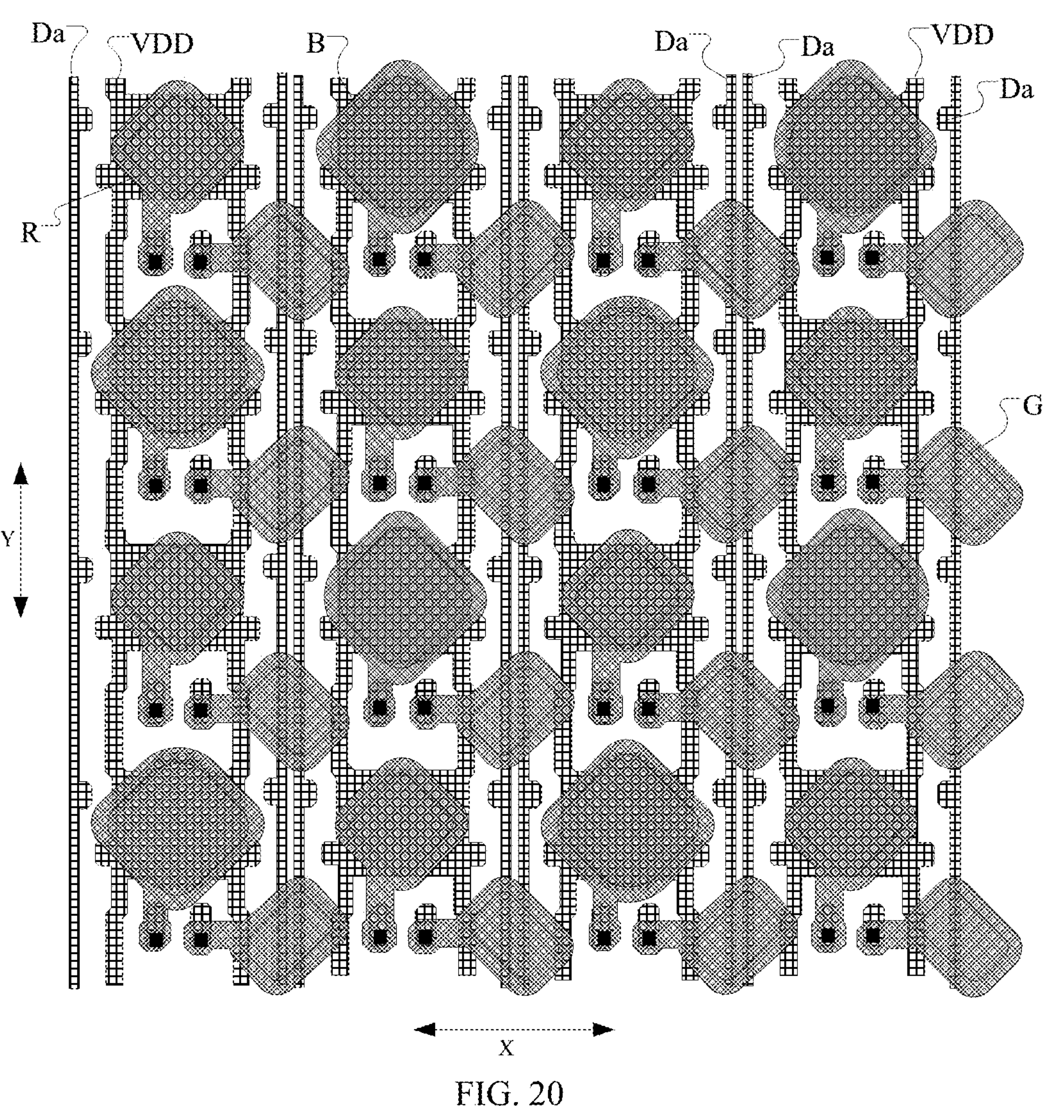
FIG. 20 is a structural layout of a fifth conductive layer and an electrode layer of a display panel according to an exemplary embodiment of the present disclosure.
Figure 21:
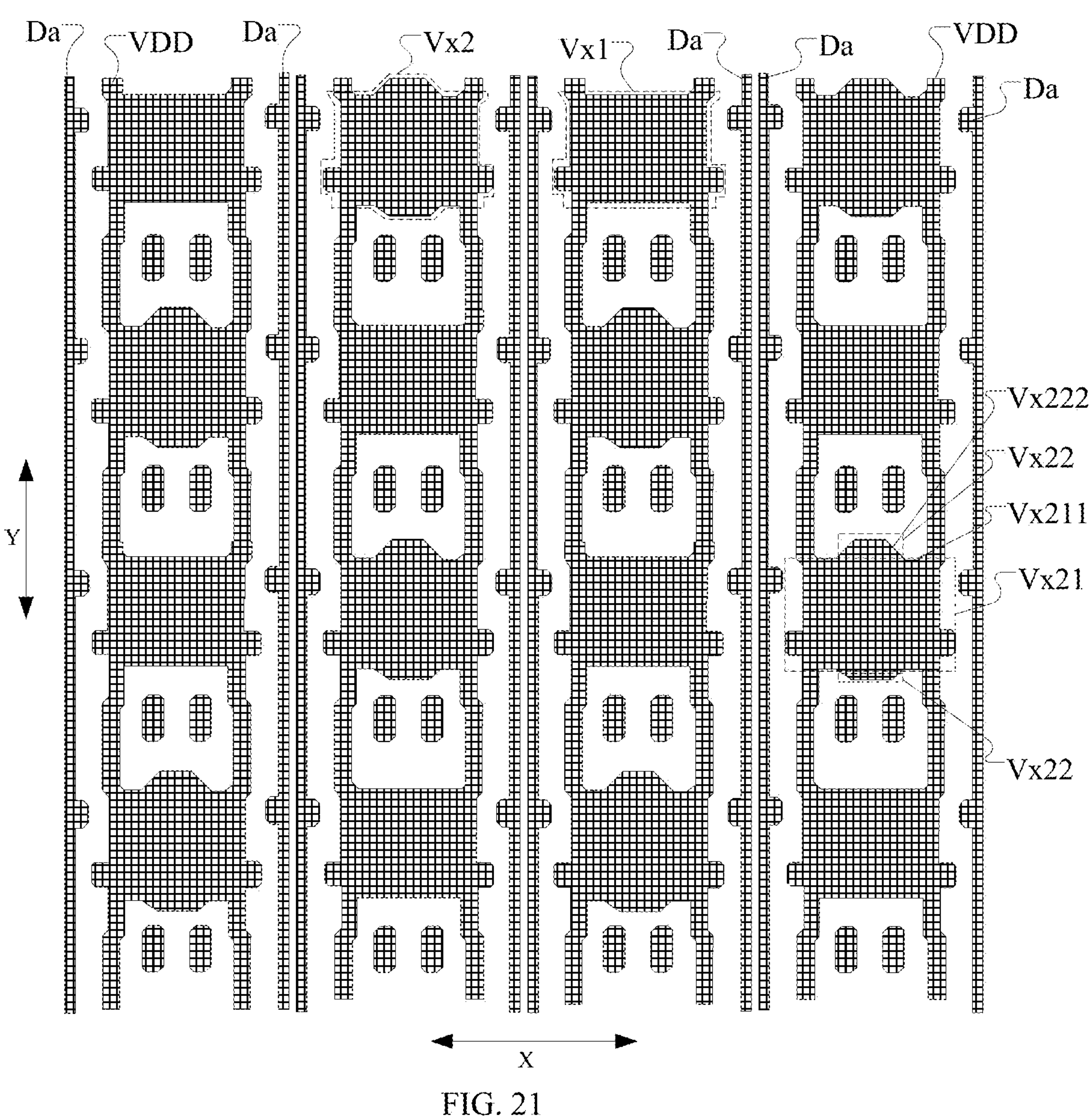
FIG. 21 is a structural layout of the fifth conductive layer of FIG. 20.
Figure 22:
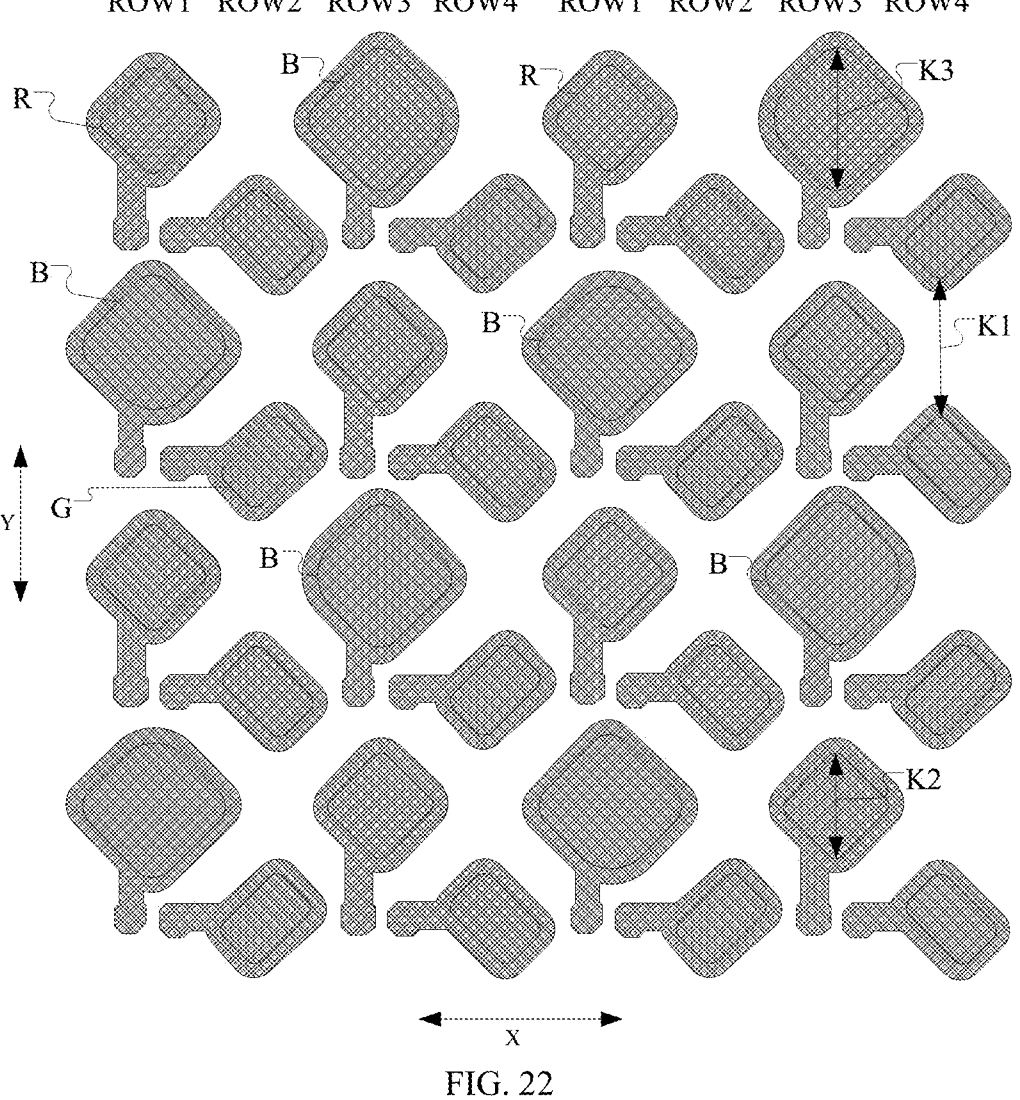
FIG. 22 is a structural layout of the electrode layer of FIG. 20.

As shown in FIGS. 3, 12, 20, 21, and 22, FIG. 20 shows a structural layout of the fifth conductive layer and the electrode layer of the display panel according to an exemplary embodiment of the present disclosure, FIG. 21 is a structural layout of the fifth conductive layer in FIG. 20, and FIG. 22 is a structural layout of the electrode layer in FIG. 20. In this exemplary embodiment, the electrode layer can include a plurality of electrode portions, i.e., first electrode portions R, third electrode portions G, and second electrode portions B. Each of the electrode portions can be connected to the tenth bridging portion 510 through a via hole, to be connected to the second electrode of the sixth transistor T6. The first electrode portion R can be used to form the first electrode of the red light-emitting unit, the second electrode portion B can be used to form the first electrode of the blue light-emitting unit, and the third electrode portion G can be used to form the first electrode of the green light-emitting unit. The plurality of electrode portions are distributed in an array along the first direction X and the second direction Y. The plurality of electrode portions distributed along the first direction X form an electrode row, and the plurality of electrode portions distributed along the second direction Y form an electrode column. In the same electrode row, the first electrode portion R, the third electrode portion G, the second electrode portion B, and the third electrode portion G are alternately distributed in sequence in the first direction X. The plurality of electrode columns includes a first electrode column ROW1, a second electrode column ROW2, a third electrode column ROW3, and a fourth electrode column ROW4 that are sequentially adjacent to each other. The first electrode column ROW1 includes the first electrode portion R and the second electrode portion B that are alternately distributed in sequence in the second direction Y. The second electrode column ROW2 includes a plurality of third electrode portions G that are distributed in the second direction Y. The third electrode column ROW3 includes the second electrode portion B and the first electrode portion R that are alternately distributed in sequence in the second direction Y. The fourth electrode column ROW4 includes a plurality of third electrode portions G distributed in the second direction Y. The minimum distance K1, in the second direction Y, between orthographic projections on the substrate of two third electrode portions G located in adjacent electrode rows within the same electrode column, is greater than the size K2 of an orthographic projection of the first electrode portion R on the substrate in the second direction Y, or greater than the size K3 of an orthographic projection of the second electrode portion B on the substrate in the second direction Y. The orthographic projection of the first electrode portion R on the substrate coincides with an orthographic projection of its corresponding opening in a pixel definition layer on the substrate. The orthographic projection of the second electrode portion B on the substrate coincides with an orthographic projection of its corresponding opening in the pixel definition layer on the substrate. The orthographic projection of the third electrode portion G on the substrate coincides with an orthographic projection of its corresponding opening in the pixel definition layer on the substrate.

As shown in FIGS. 20, 21, and 22, an area of the orthographic projection of the first electrode portion R on the substrate is greater than an area of the orthographic projection of the third electrode portion G on the substrate, and is smaller than an area of the orthographic projection of the second electrode portion B on the substrate. In the same repeatable unit, two second power line segments VDD2 connected to each other form a power supply portion. A plurality of power supply portions include a first power supply portion Vx1 corresponding to the first electrode portion R and a second power supply portion Vx2 corresponding to the second electrode portion B. The orthographic projection of the first electrode portion R on the substrate and an orthographic projection, on the substrate, of the first power supply portion Vx1 corresponding the first electrode portion R are at least partially overlapped. The orthographic projection of the second electrode portion B on the substrate and an orthographic projection, on the substrate, of the second power supply portion Vx2 corresponding to the second electrode portion B are at least partially overlapped.

As shown in FIGS. 20, 21, and 22, an overlapping area, between the orthographic projection of the first electrode portion R on the substrate and the orthographic projection of the first power supply portion Vx1 corresponding to the first electrode portion R on the substrate, is B1. An area of the orthographic projection of the first electrode portion R on the substrate is B2. The ratio B1/B2 can be greater than or equal to 80%. For example, B1/B2 can be equal to 80%, 90%, 95%, or 100%. When B1/B2 is equal to 100%, it means that the orthographic projection of the first electrode portion R on the substrate is located directly on the orthographic projection of its corresponding first power supply portion Vx1 on the substrate. An overlapping area, between the orthographic projection of the second electrode portion B on the substrate and the orthographic projection of the second power supply portion Vx2 corresponding to the second electrode portion B on the substrate, is C1. An area of the orthographic projection of the second electrode portion B on the substrate is C2. The ratio C1/C2 can be greater than or equal to 80%. For example, C1/C2 can be equal to 80%, 90%, 95%, or 100%. When C1/C2 is equal to 100%, it means that the orthographic projection of the second electrode portion B on the substrate is located directly on the orthographic projection of its corresponding second power supply portion Vx2 on the substrate.

As shown in FIGS. 20, 21, and 22, the area of the orthographic projection, on the substrate, of the first power supply portion Vx1 corresponding to the first electrode portion R is A1, and the area of the orthographic projection, on the substrate, of the second power supply portion Vx2 corresponding to the second electrode portion B is A2, where A2 is greater than A1. In this exemplary embodiment, by increasing the area of the orthographic projection of the second power supply portion Vx2 on the substrate, it is possible to ensure that the orthographic projection, on the substrate, of all or most of the structure of the second electrode portion B lies within the orthographic projection of the second power supply portion Vx2 on the substrate. This can improve the flatness of the second electrode portion B, thereby reducing the risk of color shift in the display panel when viewed from different angles. In this exemplary embodiment, the overlapping area, between the orthographic projection of the second power supply portion Vx2 on the substrate and the orthographic projection of its corresponding second electrode portion B on the substrate, can be larger than the overlapping area, between the orthographic projection of the first power supply portion Vx1 on the substrate and the orthographic projection of its corresponding first electrode portion R on the substrate.

As shown in FIGS. 20, 21, and 22, the second power supply portion Vx2 can include a main body portion Vx21 and two additional portions Vx22, with the two additional portions being connected to two sides of the main body portion Vx21 along the second direction Y. The main body portion Vx21 includes a first side edge Vx211 on one side located in the second direction Y, and the additional portion Vx22 includes a second side edge Vx222 connected to the first side edge Vx211. An angle between the orthographic projection of the first side edge Vx211 on the substrate and the orthographic projection of the second side edge Vx222 on the substrate can be less than 180°.

It should be noted that, as shown in FIGS. 3, 18, 19, and 20, the black squares drawn on the side of the fourth conductive layer backing away from the substrate indicate the via holes connecting the fourth conductive layer to other layers on the side of the fourth conductive layer facing the substrate; the black squares drawn on the side of the fifth conductive layer backing away from the substrate indicate the via holes connecting the fifth conductive layer to other layers on the side of the fifth conductive layer facing the substrate; and the black squares drawn on the side of the electrode layer backing away from the substrate indicate the via holes connecting the electrode layer to other layers on the side of the electrode layer facing the substrate. The black squares indicate only the positions of the via holes, and different via holes indicated by black squares at different positions can penetrate through different insulating layers.

Figure 23:
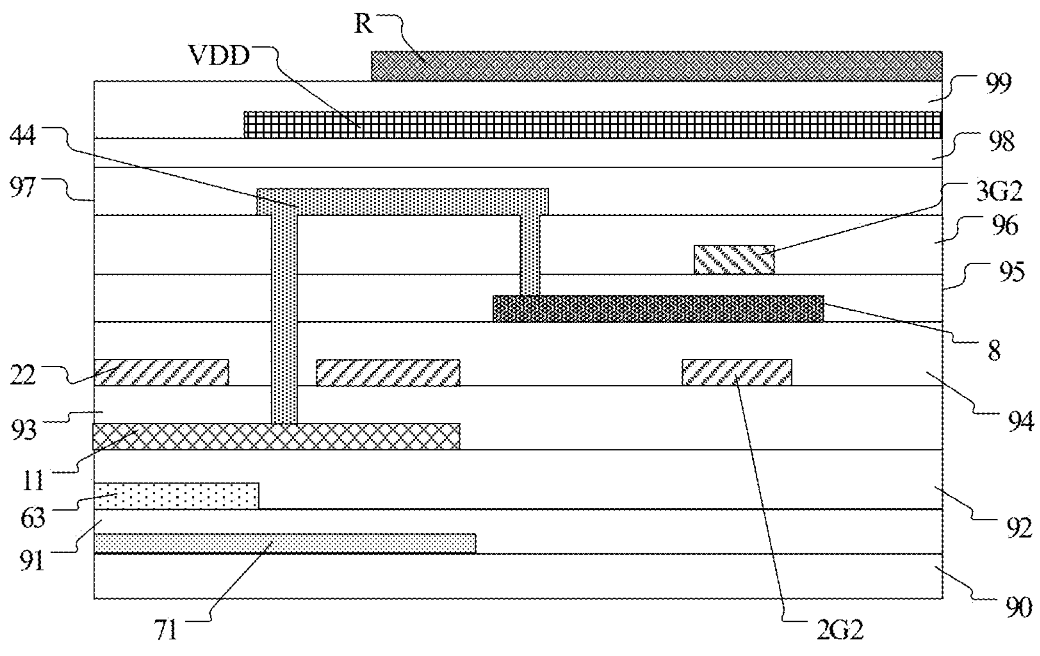
FIG. 23 is a partial sectional view of the display panel shown in FIG. 3 sectioned along dashed line AA.

As shown in FIG. 23, it is a partial cross-sectional view of the display panel shown in FIG. 3 sectioned along the dashed line AA. The display panel can further include a first insulating layer 91, a second insulating layer 92, a third insulating layer 93, a fourth insulating layer 94, a fifth insulating layer 95, a first dielectric layer 96, a passivation layer 97, a first planarization layer 98, and a second planarization layer 99. Herein, the substrate 90, the shielding layer, the first insulating layer 91, the first active layer, the second insulating layer 92, the first conductive layer, the third insulating layer 93, the second conductive layer, the fourth insulating layer 94, the second active layer, the fifth insulating layer 95, the third conductive layer, the first dielectric layer 96, the fourth conductive layer, the passivation layer 97, the first planarization layer 98, the fifth conductive layer, the second planarization layer 99, and the electrode layer are stacked in sequence. The first insulating layer 91, the second insulating layer 92, the third insulating layer 93, the fourth insulating layer 94, and the fifth insulating layer 95 can be single-layer or multi-layer structures, and the materials of the first insulating layer 91, the second insulating layer 92, the third insulating layer 93, the fourth insulating layer 94, and the fifth insulating layer 95 can include at least one of silicon nitride, silicon oxide, and silicon oxynitride. The first dielectric layer 96 can be a silicon nitride layer. The materials of the first planarization layer 98 and the second planarization layer 99 can be organic materials, such as polyimide (PI), polyethylene terephthalate (PET), polyethylene naphthalate (PEN), silicon-on-glass (SOG), etc. The substrate 90 can include a glass substrate, a barrier layer, and a polyimide layer stacked in sequence, and the barrier layer can be made of an inorganic material. The passivation layer 97 can be a silicon oxide layer. The materials of the first conductive layer, the second conductive layer, and the third conductive layer can be one of molybdenum, aluminum, copper, titanium, niobium, or an alloy thereof, or a molybdenum/titanium alloy or a stack thereof. The materials of the fourth conductive layer and the fifth conductive layer can include metallic materials, such as one of molybdenum, aluminum, copper, titanium, niobium, or an alloy thereof, or a molybdenum/titanium alloy or a stack thereof, or a stack of titanium/aluminum/titanium. The electrode layer can include an indium tin oxide layer and a silver layer. The sheet resistance of any one of the first conductive layer, the second conductive layer, and the third conductive layer can be greater than the sheet resistance of any one of the fourth conductive layer and the fifth conductive layer.

It should be noted that the scale of the accompanying drawings in the present disclosure can be used as a reference in the actual process, but is not limited thereto, for example, the width-to-length ratio of the channel, the thickness and spacing of the individual film layers, and the width and spacing of the individual signal lines can be adjusted according to the actual needs. The number of pixels in the display substrate and the number of sub-pixels in each pixel are also not limited to the number shown in the drawings, and the accompanying drawings depicted in the present disclosure are only schematic diagrams of the structure. In addition, the qualifiers such as first, second, etc. are only used to qualify different structure names, which have no meaning in a particular order. In this exemplary embodiment, a certain structure's orthographic projection on the substrate extends in a certain direction, which can be understood as the structure's orthographic projection on the substrate extends in a straight line or bends in that direction. A transistor is a component that includes at least three terminals, a gate, a drain, and a source. The transistor has a channel region between the drain (also called drain terminal, drain region, or drain electrode) and the source (also called source terminal, source region, or source electrode), and current can flow through the drain, the channel region, and the source. In this exemplary embodiment, the channel region is the region through which the current primarily flows. In this exemplary embodiment, the first electrode may be a drain and the second electrode may a source. Alternatively, the first electrode may be a source and the second electrode may be a drain. In the case where transistors of opposite polarity are used, or in the case where the direction of the current in the circuit operation changes, the functions of the "source" and the "drain" are sometimes switched with each other. Therefore, in this exemplary embodiment, the "source" and the "drain" may be switched with each other. In addition, the gate can be referred to as a control electrode.

Figure 24:
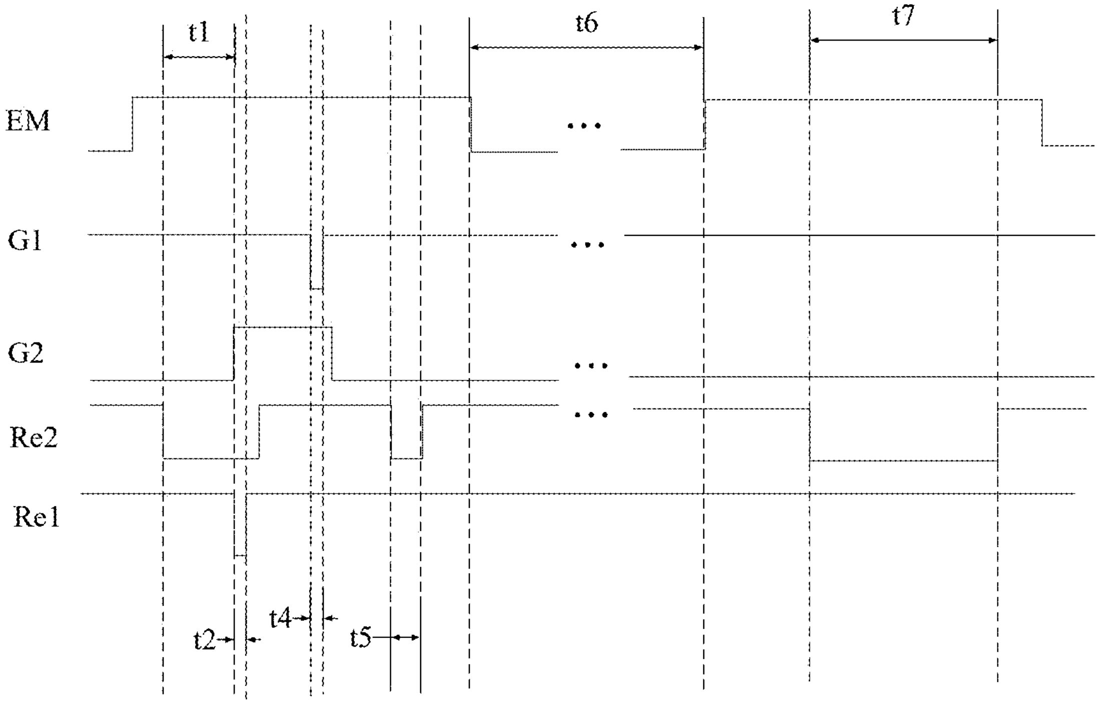
FIG. 24 is a timing diagram of signals on various nodes in an alternative driving method of the pixel driving circuit shown in FIG. 1.

As shown in FIG. 24, it is a timing diagram of signals on various nodes in an alternative driving method of the pixel driving circuit shown in FIG. 1. EM denotes a timing diagram of the signal on the enable signal terminal. G1 denotes a timing diagram of the signal on the first gate driving signal terminal. G2 denotes a timing diagram of the signal on the second gate driving signal terminal. Re1 denotes a timing diagram of the signal on the first reset signal terminal. Re2 denotes a timing diagram of the signal on the second reset signal terminal. The driving method may differ from the driving method shown in FIG. 2 only in that the timing of the signal on the first reset signal terminal is different. In this exemplary embodiment, the first reset signal terminal and the second reset signal terminal can be supplied with signals by different gate driving circuits. The first reset signal terminal can output a low level signal only during the reset phase t2.

Figure 25:
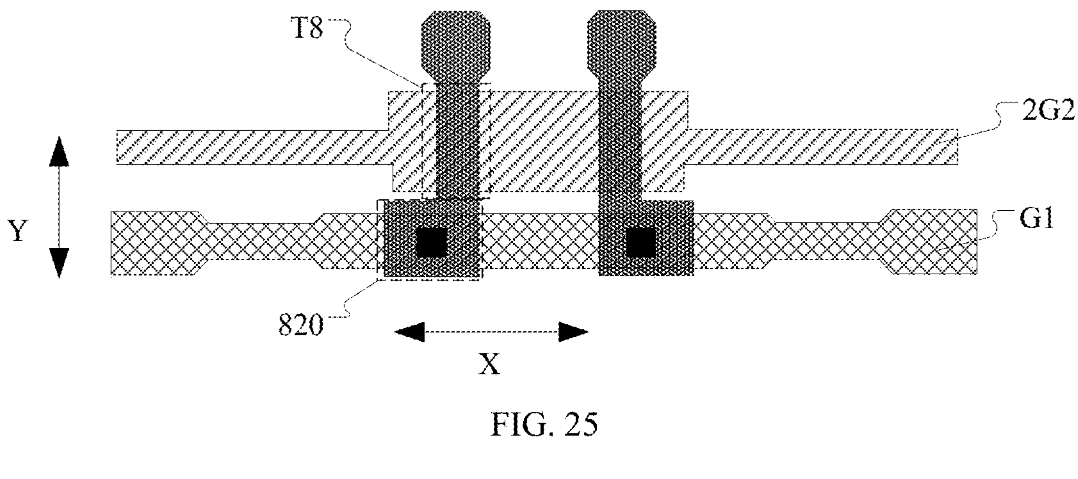
FIG. 25 is a partial structural layout of a display panel according to another exemplary embodiment of the present disclosure.
Figure 26:
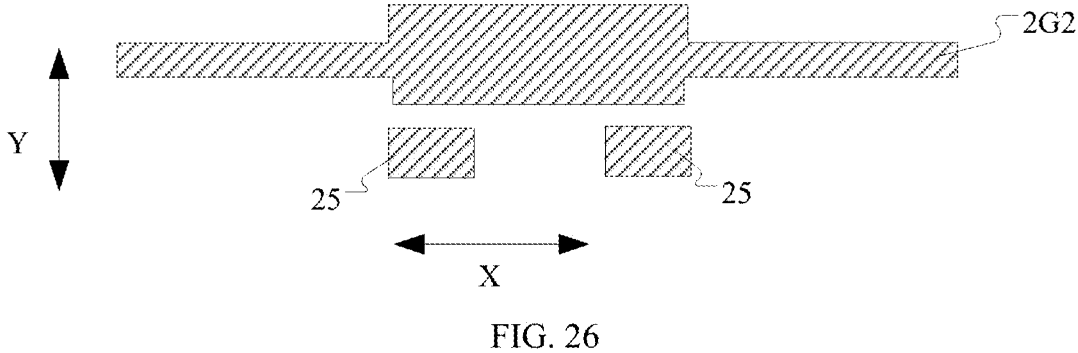
FIG. 26 is a structural layout of a second conductive layer in the display panel shown in FIG. 25.

As shown in FIGS. 25-26, FIG. 25 is a partial structural layout of a display panel according to another exemplary embodiment of the present disclosure. This display panel may differ from the display panel shown in FIG. 3 only in that the second conductive layer is different. FIG. 26 shows a structural layout of the second conductive layer in the display panel shown in FIG. 25. In this display panel, the second conductive layer can further include a coupling portion 25, whose orthographic projection on the substrate overlaps at least partially with the orthographic projection of the first gate line G1 on the substrate. The twentieth active portion 820 can be connected to the coupling portion 25 through a via hole. Since the twentieth active portion 820 is an equipotential structure of the gate of the driver transistor T3, at the end of the data writing phase, the first gate line G1 can pull up the voltage of the gate of the driver transistor through the coupling portion. This arrangement can reduce the black state voltage of the display panel, or reduce the area of the orthographic projection of the twentieth active portion 820 on the substrate while keeping the black state voltage unchanged.

This exemplary embodiment also provides a display device including the display panel as described above. The display device can be a cell phone, a tablet computer, a television, and the like.

A person skilled in the art, after considering the specification and practicing the content disclosed herein, will readily conceive of other embodiments of the present disclosure. This application is intended to cover any modifications, uses, or adaptive changes of the present disclosure that follow the general principles thereof and include common knowledge or customary technical means in the technical field that are not disclosed herein. The specification and embodiments are to be considered as exemplary only, and the true scope and spirit of the present disclosure are indicated by the claims.

The accompanying drawings in the present disclosure relate only to the structures involved in the present disclosure, and other structures can be referred to the usual design. Without conflict, the embodiments and features in the embodiments of the present disclosure may be combined with each other to obtain new embodiments. Those of ordinary skill in the art should understand that modifications or equivalent substitutions can be made to the technical solutions of the present disclosure without departing from the spirit and scope of the technical solutions of the present disclosure, and all should be covered by the scope of the claims of the present disclosure.

It should be understood that the present disclosure is not limited to the precise structure that has been described above and illustrated in the accompanying drawings, and that various modifications and changes can be made without departing from its scope. The scope of the present disclosure is limited only by the appended claims.

What is claimed is:

1. A display panel, comprising:

a substrate;

a pixel driving circuit on a side of the substrate, the pixel driving circuit comprising:

a driver transistor;

a ninth transistor, a first electrode of the ninth transistor being connected to a third initial signal line, and a second electrode of the ninth transistor being connected to a first electrode of the driver transistor;

an eighth transistor, a first electrode of the eighth transistor being connected to a gate of the driver transistor;

a first transistor, a first electrode of the first transistor being connected to a first initial signal line, and a second electrode of the first transistor being connected to a second electrode of the eighth transistor; and a second transistor, a first electrode of the second transistor being connected to the second electrode of the eighth transistor, and a second electrode of the second transistor being connected to a second electrode of the driver transistor;

a first active layer on a side of the substrate, the first active layer comprising:

a second active portion configured to form a channel region of the second transistor, and a third active portion configured to form a channel region of the driver transistor;

a first conductive layer on a side, away from the substrate, of the first active layer, the first conductive layer comprising:

a first gate line, wherein an orthographic projection of the first gate line on the substrate extends in a first direction and covers an orthographic projection of the second active portion on the substrate, and a portion of a structure of the first gate line is configured to form a gate of the second transistor; and a first conductive portion, wherein an orthographic projection of the first conductive portion on the substrate covers an orthographic projection of the third active portion on the substrate, and the first conductive portion is configured to form the gate of the driver transistor;

a second active layer on a side, away from the substrate, of the first conductive layer, the second active layer comprising an eighth active portion configured to form a channel region of the eighth transistor; and a third conductive layer on a side, away from the substrate, of the second active layer, the third conductive layer comprising a second gate line, wherein an orthographic projection of the second gate line on the substrate extends in the first direction and covers an orthographic projection of the eighth active portion on the substrate, and a portion of a structure of the second gate line is configured to form a top gate of the eighth transistor;

wherein the orthographic projection of the first gate line on the substrate is between the orthographic projection of the second gate line on the substrate and the orthographic projection of the first conductive portion on the substrate.

2. The display panel according to claim 1, wherein the second active portion further comprises a twentieth active portion connected to the eighth active portion, and the twentieth active portion is connected to the first conductive portion; and wherein an orthographic projection of the twentieth active portion on the substrate is at least partially overlapped with the orthographic projection of the first gate line on the substrate.

3. The display panel according to claim 2, wherein a size, in the first direction, of the orthographic projection of the twentieth active portion on the substrate is greater than a size, in a second direction, of the orthographic projection of the twentieth active portion on the substrate; and wherein the first direction intersects the second direction.

4. The display panel according to claim 2, wherein a size, in the first direction, of the orthographic projection of the eighth active portion on the substrate is L1, and a size, in the first direction, of the orthographic projection of the twentieth active portion on the substrate is L2; and wherein L2/L1 is greater than or equal to 2 and less than or equal to 7.

5. The display panel according to claim 1, wherein the pixel driving circuit further comprises a fourth transistor, a first electrode of the fourth transistor being connected to a data line, and a second electrode of the fourth transistor being connected to the first electrode of the driver transistor;

the first active layer further comprises a fourth active portion, wherein the fourth active portion is configured to form a channel region of the fourth transistor; and wherein, in the first direction, an orthographic projection of the eighth active portion on the substrate is between an orthographic projection of the second active portion on the substrate and an orthographic projection of the fourth active portion on the substrate.

6. The display panel according to claim 1, further comprising a light-emitting unit, wherein the pixel driving circuit further comprises a seventh transistor, a first electrode of the seventh transistor being connected to a second initial signal line, and a second electrode of the seventh transistor being connected to a first electrode of the light-emitting unit; and the first active layer further comprises a seventh active portion and a ninth active portion, wherein the seventh active portion is configured to form a channel region of the seventh transistor, and the ninth active portion is configured to form a channel region of the ninth transistor; and the first conductive layer further comprises a second reset signal line, wherein an orthographic projection of the second reset signal line on the substrate extends in a first direction and covers an orthographic projection of the seventh active portion on the substrate and an orthographic projection of the ninth active portion on the substrate, and a portion of a structure of the second reset signal line is configured to form a gate of the seventh transistor, and another portion of the structure of the second reset signal line is configured to form a gate of the ninth transistor.

7. The display panel according to claim 6, wherein the first active layer further comprises:

a first active portion configured to form a channel region of the first transistor; and wherein the first conductive layer further comprises:

a first reset signal line, wherein an orthographic projection of the first reset signal line on the substrate covers an orthographic projection of the first active portion on the substrate, and a portion of a structure of the first reset signal line is configured to form a gate of the first transistor;

wherein, in a same pixel driving circuit, an orthographic projection of the first conductive portion on the substrate is between the orthographic projection of the first reset signal line on the substrate and the orthographic projection of the second reset signal line on the substrate; and the second reset signal line in the pixel driving circuit of a current row is shared as the first reset signal line in the pixel driving circuit of an adjacent next row.

8. The display panel according to claim 1, wherein the first conductive layer further comprises a first reset signal line, wherein a portion of a structure of the first reset signal line is configured to form a gate of the first transistor;

the display panel further comprises a second conductive layer on a side, away from the substrate, of the first conductive layer, the second conductive layer comprising the third initial signal line;

wherein, in a same said pixel driving circuit, an orthographic projection of the first reset signal line on the substrate is on a side, away from an orthographic projection of the first conductive portion on the substrate, of an orthographic projection of the second gate line on the substrate; and an orthographic projection, on the substrate, of the third initial signal line in the pixel driving circuit of an adjacent previous row is between the orthographic projection, on the substrate, of the first reset signal line in the pixel driving circuit of a current row and the orthographic projection, on the substrate, of the second gate line in the pixel driving circuit of the current row.

9. The display panel according to claim 1, further comprising a light-emitting unit, wherein the pixel driving circuit further comprises a seventh transistor, a first electrode of the seventh transistor being connected to a second initial signal line, and a second electrode of the seventh transistor being connected to a first electrode of the light-emitting unit;

the first conductive layer further comprises a second reset signal line, wherein a portion of a structure of the second reset signal line is configured to form a gate of the seventh transistor;

the third conductive layer further comprises the first initial signal line;

wherein, in a same pixel driving circuit, an orthographic projection of the second reset signal line on the substrate is on a side, away from an orthographic projection of the first gate line on the substrate, of an orthographic projection of the first conductive portion on the substrate; and an orthographic projection, on the substrate, of the first initial signal line in the pixel driving circuit of an adjacent next row is between the orthographic projection, on the substrate, of the second reset signal line in the pixel driving circuit of a current row and the orthographic projection, on the substrate, of the first conductive portion in the pixel driving circuit of the current row.

10. The display panel according to claim 1, wherein the pixel driving circuit further comprises a fifth transistor, a first electrode of the fifth transistor being connected to a power line, and a second electrode of the fifth transistor being connected to the first electrode of the driver transistor;

the first active layer further comprises a fifth active portion configured to form a channel region of the fifth transistor;

the first conductive layer further comprises an enable signal line, wherein an orthographic projection of the enable signal line on the substrate extends in a first direction and covers an orthographic projection of the fifth active portion on the substrate, and a portion of a structure of the enable signal line is configured to form a gate of the fifth transistor;

the third conductive layer further comprises the first initial signal line; and wherein an orthographic projection, on the substrate, of the first initial signal line in the pixel driving circuit of an adjacent next row is at least partially overlapped with the orthographic projection, on the substrate, of the enable signal line in the pixel driving circuit of a current row.

11. The display panel according to claim 10, wherein, in a first unit pixel, an area of the orthographic projection, on the substrate, of the first initial signal line in the pixel driving circuit of the adjacent next row is S1;

in the first unit pixel, an overlapping area, between the orthographic projection, on the substrate, of the first initial signal line in the pixel driving circuit of the adjacent next row and the orthographic projection, on the substrate, of the enable signal line in the pixel driving circuit of the current row, is S2; and S2/S1 is greater than or equal to 60%.

12. The display panel according to claim 1, further comprising a light-emitting unit, wherein the pixel driving circuit further comprises a seventh transistor, a first electrode of the seventh transistor being connected to a second initial signal line, and a second electrode of the seventh transistor being connected to a first electrode of the light-emitting unit;

wherein the display panel further comprises:

a fourth conductive layer on a side, away from the substrate, of the third conductive layer, the fourth conductive layer comprising the second initial signal line, wherein the second initial signal line comprises a first initial signal sub-line and/or a second initial signal sub-line; and wherein an orthographic projection of the first initial signal sub-line on the substrate extends in a first direction, and an orthographic projection of the second initial signal sub-line on the substrate extends in a second direction, the first direction and the second direction intersecting.

13. The display panel according to claim 12, wherein, when the second initial signal line comprises the first initial signal sub-line, an orthographic projection of the first initial signal sub-line on the substrate is at least partially overlapped with an orthographic projection of the third initial signal line on the substrate; and wherein, in a second unit pixel, an area of the orthographic projection of the first initial signal sub-line on the substrate is S3; an overlapping area, between the orthographic projection of the first initial signal sub-line on the substrate and the orthographic projection of the third initial signal line on the substrate, is S4; and S4/S3 is greater than or equal to 50%.

14. The display panel according to claim 12, wherein, when the second initial signal line comprises the first initial signal sub-line and the second initial signal sub-line, the second initial signal sub-line is connected to the first initial signal sub-line intersecting with the second initial signal sub-line.

15. The display panel according to claim 12, comprising a plurality of repeatable units distributed in an array along the first direction and the second direction, wherein the repeatable unit comprises two pixel driving circuits distributed along the first direction, and the two pixel driving circuits in the same repeatable unit are disposed in mirror symmetry with respect to a mirror symmetry plane;

more than one repeatable unit, among the repeatable units, distributed in the second direction form a repeatable unit column, wherein, when the second initial signal line comprises the second initial signal sub-line, at least a portion of repeatable unit columns is provided in correspondence with one second initial signal sub-line, and wherein an orthographic projection of the mirror symmetry plane on the substrate is located on the orthographic projection of the second initial signal sub-line on the substrate.

16. The display panel according to claim 1, comprising a plurality of repeatable units distributed in an array along a first direction and a second direction, wherein the repeatable unit comprises two pixel driving circuits distributed along the first direction, and the two pixel driving circuits in the same repeatable unit are disposed in mirror symmetry with respect to a mirror symmetry plane, the first direction and the second direction intersecting;

wherein the pixel driving circuit further comprises a fifth transistor, a first electrode of the fifth transistor being connected to a power line, and a second electrode of the fifth transistor being connected to the first electrode of the driver transistor;

the first active layer further comprises a fifth active portion, and a thirteenth active portion, wherein the fifth active portion is configured to form a channel region of the fifth transistor, and the thirteenth active portion is connected to a side, away from the third active portion, of the fifth active portion; and wherein, in repeatable units adjacent in the first direction, the fifth active portions in two adjacent pixel driving circuits are connected through the same thirteenth active portion, and the thirteenth active portion is connected to the power line.

17. The display panel according to claim 1, comprising a plurality of repeatable units distributed in an array along a first direction and a second direction, wherein the repeatable unit comprises two pixel driving circuits distributed along the first direction, and the two pixel driving circuits in the same repeatable unit are disposed in mirror symmetry with respect to a mirror symmetry plane, the first direction and the second direction intersecting;

wherein the display panel further comprises a light-emitting unit, the pixel driving circuit is connected to a first electrode of the light-emitting unit, and the pixel driving circuit further comprises a sixth transistor and a seventh transistor, and wherein a first electrode of the sixth transistor is connected to the second electrode of the driver transistor, a second electrode of the sixth transistor is connected to the first electrode of the light-emitting unit, a first electrode of the seventh transistor is connected to a second initial signal line, and a second electrode of the seventh transistor is connected to the first electrode of the light-emitting unit;

the first active layer further comprises a sixth active portion, a seventh active portion, and a seventeenth active portion, wherein the sixth active portion is configured to form a channel region of the sixth transistor, the seventh active portion is configured to form a channel region of the seventh transistor, and the seventeenth active portion is connected to a side, away from the sixth active portion, of the seventh active portion; and wherein, in a same repeatable unit, the seventh active portions in two adjacent pixel driving circuits are connected through the same seventeenth active portion, and the seventeenth active portion is connected to the second initial signal line.

18. The display panel according to claim 1, further comprising:

a fourth conductive layer on a side of the substrate;

a fifth conductive layer on a side, away from the substrate, of the fourth conductive layer, wherein the fifth conductive layer comprises a power line, an orthographic projection of the power line on the substrate extending in a second direction; wherein the power line comprises a first power line segment, a second power line segment, and a third power line segment, and wherein the second power line segment is connected between the first power line segment and the third power line segment, two adjacent second power line segments are connected in a same repeatable unit, the connected second power line segments form a power supply portion, and a plurality of the power supply portions comprise a first power supply portion and a second power supply portion;

an electrode layer on a side, away from the substrate, of the fifth conductive layer, the electrode layer comprising a plurality of electrode portions, wherein the plurality of electrode portions comprise a first electrode portion and a second electrode portion, and an orthographic projection of the first electrode portion on the substrate is smaller than an orthographic projection of the second electrode portion on the substrate; and a pixel definition layer on a side, away from the substrate, of the electrode layer, the pixel definition layer having a plurality of openings formed for forming light-emitting units, wherein the plurality of openings are provided in correspondence with the electrode portions, and an orthographic projection of the opening on the substrate coincides with an orthographic projection of the electrode portion provided in correspondence with the opening on the substrate;

wherein the first electrode portion is provided in correspondence with the first power supply portion, the second electrode portion is provided in correspondence with the second power supply portion, an orthographic projection of the first electrode portion on the substrate is at least partially overlapped with an orthographic projection of the first power supply portion provided in correspondence with the first electrode portion on the substrate, and an orthographic projection of the second electrode portion on the substrate is at least partially overlapped with an orthographic projection of the second power supply portion provided in correspondence with the second electrode portion on the substrate; and wherein an area of the orthographic projection of the second power supply portion on the substrate is greater than an area of the orthographic projection of the first power supply portion on the substrate, and an overlapping area, between the orthographic projection of the second power supply portion on the substrate and the orthographic projection of the second electrode portion corresponding to the second power supply portion on the substrate, is greater than an overlapping area, between the orthographic projection of the first power supply portion on the substrate and the orthographic projection of the first electrode portion corresponding to the first power supply portion on the substrate.

19. A display device, comprising the display panel according to claim 1.

* * * * *